(12) United States Patent
Ikeda et al.

(10) Patent No.: US 8,182,977 B2
(45) Date of Patent: May 22, 2012

(54) POLYMER AND POSITIVE-TONE RADIATION-SENSITIVE RESIN COMPOSITION

(75) Inventors: Norihiko Ikeda, Tokyo (JP); Hiromitsu Nakashima, Tokyo (JP); Saki Harada, Tokyo (JP)

(73) Assignee: JSR Corporation, Tokyo (JP)

( * ) Notice: Subject to any disclaimer, the term of this patent is extended or adjusted under 35 U.S.C. 154(b) by 302 days.

(21) Appl. No.: 12/729,244

(22) Filed: Mar. 23, 2010

(65) Prior Publication Data

US 2010/0239981 A1    Sep. 23, 2010

(30) Foreign Application Priority Data

Mar. 23, 2009 (JP) .................... 2009-69952
Apr. 2, 2009 (JP) .................... 2009-90246

(51) Int. Cl.
G03F 7/004 (2006.01)
C08F 220/26 (2006.01)

(52) U.S. Cl. .............. 430/270.1; 430/905; 430/910; 526/269; 526/280; 526/281; 526/282

(58) Field of Classification Search .............. 430/270.1, 430/905, 910; 526/280, 281, 282
See application file for complete search history.

(56) References Cited

U.S. PATENT DOCUMENTS

| 5,910,392 | A * | 6/1999 | Nozaki et al. ............... 430/270.1 |
| 6,344,590 | B1 * | 2/2002 | Nakano et al. ................ 568/591 |
| 7,119,156 | B2 * | 10/2006 | Okino et al. .................... 526/282 |
| 8,048,612 | B2 * | 11/2011 | Fuji et al. ................... 430/270.1 |
| 2004/0202954 | A1 * | 10/2004 | Momota et al. ............... 430/170 |
| 2005/0158662 | A1 * | 7/2005 | Furukawa et al. ......... 430/281.1 |
| 2008/0171270 | A1 * | 7/2008 | Padmanaban et al. ............ 430/5 |
| 2009/0053652 | A1 * | 2/2009 | Chakrapani et al. ....... 430/286.1 |

* cited by examiner

Primary Examiner — John Chu

(74) Attorney, Agent, or Firm — Ditthavong Mori & Steiner, P.C.

(57) ABSTRACT

A polymer includes a repeating unit (a-1) shown by a following formula (a-1), a repeating unit (a-2) shown by a following formula (a-2), and a GPC weight average molecular weight of about 1000 to about 100,000,

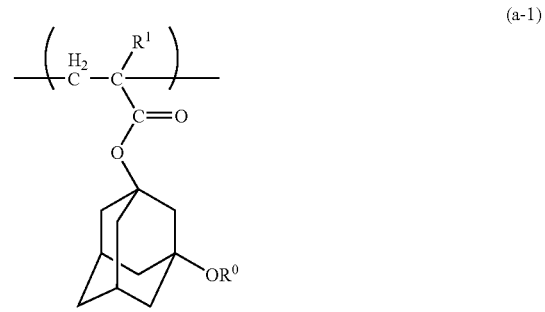

(a-1)

wherein $R^0$ represents an alkyl group having 1 to 5 carbon atoms in which at least one hydrogen atom is substituted by a hydroxyl group, and $R^1$ represents a hydrogen atom, a methyl group, or a trifluoromethyl group,

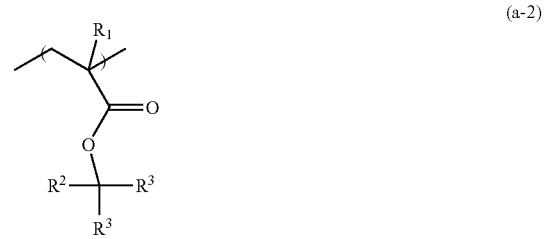

(a-2)

wherein $R^1$ represents a hydrogen atom, a methyl group, or a trifluoromethyl group, $R^2$ represents an alkyl group having 1 to 4 carbon atoms, and $R^3$ represents an alkyl group having 1 to 4 carbon atoms, a substituted or unsubstituted monovalent cyclic hydrocarbon group having 4 to 20 carbon atoms, or a divalent cyclic hydrocarbon group having 4 to 20 carbon atoms formed by $R^3$ and $R^3$ bonding to each other together with a carbon atom.

10 Claims, No Drawings

POLYMER AND POSITIVE-TONE RADIATION-SENSITIVE RESIN COMPOSITION

CROSS-REFERENCE TO RELATED APPLICATIONS

The present application claims priority under 35 U.S.C. §119 to Japanese Patent Application No. 2009-69952, filed Mar. 23, 2009, and No. 2009-90246, filed Apr. 2, 2009. The contents of these applications are incorporated herein by reference in their entirety.

BACKGROUND OF THE INVENTION

1. Field of the Invention

The present invention relates to a polymer and a positive-tone radiation-sensitive resin composition.

2. Discussion of the Background

A chemically-amplified positive-tone radiation-sensitive resin composition is a composition generating an acid when exposed to deep ultraviolet rays having a wavelength of 250 nm or less (e.g. a KrF excimer laser and an ArF excimer laser) or electron beams and causing a solubility rate difference between an exposed area and a non-exposed area in a developing solution by a chemical reaction catalyzed by the acid, thereby forming a resist pattern on a substrate.

For example, when a KrF excimer laser (wavelength: 248 nm) is used as a light source, a chemically-amplified radiation-sensitive resin composition containing a polymer having a poly(hydroxystyrene) (hereinafter referred to from time to time as "PHS") skeleton having a small absorbance of a light at a wavelength of 248 nm is used. An excellent pattern can be formed at high sensitivity and high resolution by using such a composition.

However, when a shorter wavelength light such as an ArF excimer laser (wavelength: 193 nm) is used as a light source in order to form a more minute pattern, it is difficult to use an aromatic compound such as PHS which has a larger absorbance of a light at a wavelength of 193 nm.

Therefore, as a lithography material using an ArF excimer laser as a light source, a resin composition containing a polymer having an alicyclic hydrocarbon skeleton, particularly a lactone skeleton repeating unit which does not have larger absorbance of a light at 193 nm wavelength has been used.

Japanese Patent Application Publications (KOKAI) No. 2002-201232, No. 2002-145955, No. 2003-84436, No. 2003-322963, and No. 2005-316136 disclose related-art technologies.

SUMMARY OF THE INVENTION

According to one aspect of the present invention, a polymer includes a repeating unit (a-1) shown by a following formula (a-1), a repeating unit (a-2) shown by a following formula (a-2), and a GPC weight average molecular weight of about 1000 to about 100,000.

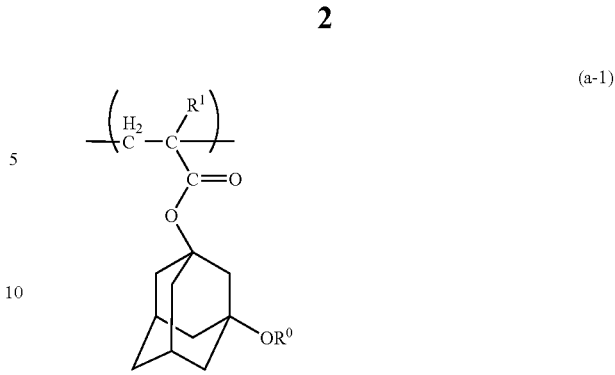

(a-1)

$R^0$ represents an alkyl group having 1 to 5 carbon atoms in which at least one hydrogen atom is substituted by a hydroxyl group, and $R^1$ represents a hydrogen atom, a methyl group, or a trifluoromethyl group.

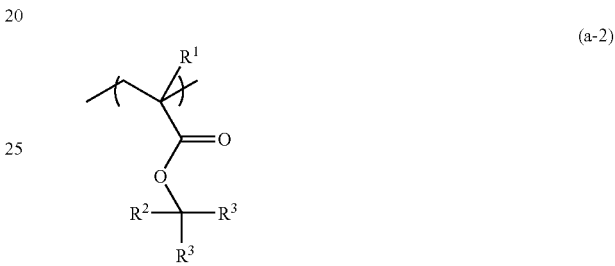

(a-2)

$R^1$ represents a hydrogen atom, a methyl group, or a trifluoromethyl group, $R^2$ represents an alkyl group having 1 to 4 carbon atoms, and $R^3$ represents an alkyl group having 1 to 4 carbon atoms, a substituted or unsubstituted monovalent cyclic hydrocarbon group having 4 to 20 carbon atoms, or a divalent cyclic hydrocarbon group having 4 to 20 carbon atoms formed by $R^3$ and $R^3$ bonding to each other together with a carbon atom to which the $R^3$ and $R^3$ bond.

According to another aspect of the present invention, a positive-tone radiation-sensitive resin composition includes a polymer (A) including a repeating unit (a-1) shown by a following formula (a-1), an acid generator (B), and a solvent (D).

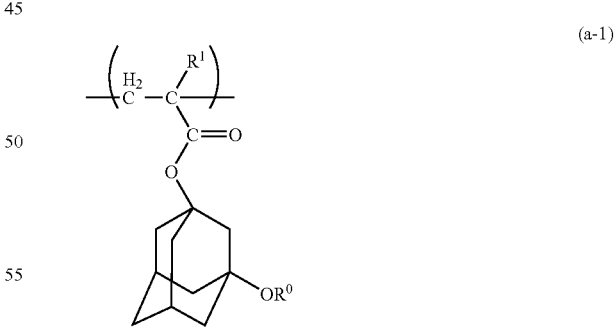

(a-1)

$R^0$ represents an alkyl group having 1 to 5 carbon atoms in which at least one hydrogen atom is substituted by a hydroxyl group, and $R^1$ represents a hydrogen atom, a methyl group, or a trifluoromethyl group.

DESCRIPTION OF THE EMBODIMENTS

Preferred embodiments of the radiation-sensitive resin composition according to the present invention are described in detail below. Note that the present invention encompasses all possible embodiments that include specific items of the present invention, and is not limited to the following embodiments. In the following description, the same types of substituent (group) are indicated by the same symbols, and description of these substituents (groups) is omitted.

The term "group" used herein indicates "group that may be substituted". For example, the term "alkyl group" includes not only an unsubstituted alkyl group, but also an alkyl group in which the hydrogen atom is substituted by a functional group. The term "group" indicates "group that may be branched". For example, the term "alkylcarbonyl group" includes not only a linear alkylcarbonyl group, but also a branched alkylcarbonyl group.

The positive-tone radiation-sensitive resin composition of an embodiment of the present invention includes a polymer (A), an acid generator (B), an acid diffusion controller (C), and a solvent (D) as essential components, and may further include an additive (E) according to the purpose of use. Each component is described below.

[1] Polymer (A)

The polymer (A) used in the embodiment of the present invention has a repeating unit (a-1) shown by the above formula (a-1) and a repeating unit (a-2) shown by the above formula (a-2).

[1-1] Repeating Unit (a-1)

The repeating unit (a-1) which is a unit shown by the above formula (a-1) is an essential repeating unit in the polymer (A).

$R^0$ in the formula (a-1) is an alkyl group having 1 to 5 carbon atoms in which at least one hydrogen atom is substituted by a hydroxyl group. The alkyl group is preferably a linear or branched alkyl group. Although not particularly limited, the number of carbon atoms in the alkyl group is preferably 2 to 4, and most preferably 2 or 3. Although not particularly limited, the number of hydroxyl groups in the alkyl group is preferably 1 to 4, more preferably 1 to 3, and most preferably 1 or 2. The hydroxyl group is bonded to preferably a terminal of a main chain or a branched chain, and more preferably a terminal of a main chain of an alkyl group, although this is not particularly limited.

$R^0$ in the embodiment of the present invention is preferably a hydroxyalkyl group or a dihydroxyalkyl group, more preferably a hydroxyethyl group or a dihydroxypropyl group, and most preferably 2-hydroxyethyl group. In this case, the repeating unit (a-1) has a structure shown by the above formula (a-5).

In the formula (a-1), $R^1$ represents a hydrogen atom, a trifluoromethyl group, or a methyl group, with a methyl group being preferable.

The polymer (A) may have one or more of the repeating units (a-1). The content of the repeating unit (a-1) in the polymer (A) is preferably about 1 to about 50 mol %, more preferably about 5 to about 30 mol %, and most preferably about 5 to about 20 mol % of the total amount of repeating units forming the polymer (A). This content of the repeating unit (a-1) can improve the developability and pattern peeling resistance of the resist. If the content of the repeating unit (a-1) is less than about 1 mol %, the pattern peeling resistance of the resist may decrease. If more than about 50 mol %, the resolution of the resist may decrease. The "content" herein refers to an amount of a monomer in percentage when synthesizing a polymer.

[1-2] Repeating Unit (a-2)

The repeating unit (a-2) which is a unit shown by the above formula (a-2) is an essential repeating unit in the polymer (A).

In the above formula (a-2), $R^1$ represents a hydrogen atom, a methyl group, or a trifluoromethyl group, preferably a hydrogen atom or a methyl group.

Specific examples of the alkyl group having 1 to 4 carbon atoms shown by $R^2$ and $R^3$ include a methyl group, an ethyl group, an n-propyl group, an i-propyl group, an n-butyl group, and an i-butyl group.

As examples of the substituted or unsubstituted cyclic hydrocarbon group having 4 to 20 carbon atoms shown by $R^3$ or formed by bonding of $R^3$ and $R^3$ together with the carbon atom to which the $R^3$ and $R^3$ are bonded, cycloalkane groups such as a cyclobutane group, a cyclopentane group, a cyclohexane group, and a cyclooctane group, and a group obtainable by excluding one or two hydrogen atoms from a bridged alicyclic structure such as norbornane, tricyclodecane, tetracyclododecane, and adamantane can be given, As examples of the substituents, a hydroxyl group, a carboxyl group, a methyl group, a methoxy group, and a cyano group can be given.

As the repeating unit (a-2), a repeating unit shown by the above formula (a-21) or a repeating unit shown by the above formula (a-22) is preferably used. As preferable examples of these units, repeating units shown by the following formulas (a-2a) to (a-2m) can be given. $R^1$ in the formulas (a-2a) to (a-2m) represents a hydrogen atom or a methyl group.

(a-2a)

(a-2b)

(a-2c)

-continued (a-2d) 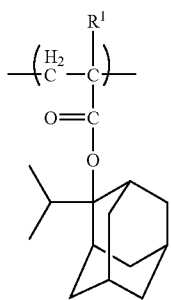

(a-2e) 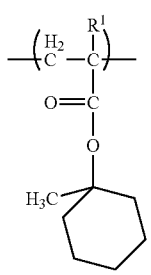

(a-2f) 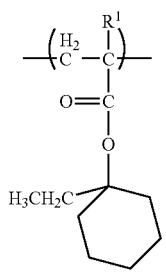

(a-2g) 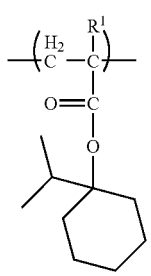

(a-2h) 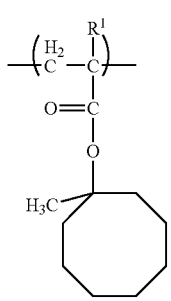

(a-2i) 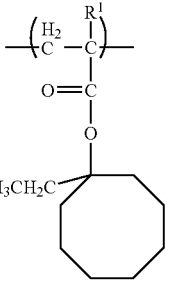

(a-2j) 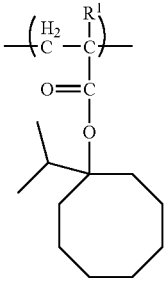

(a-2k) 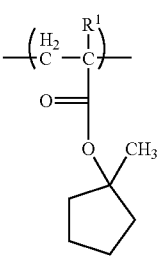

(a-2l) 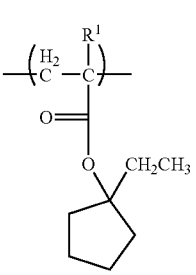

(a-2m) 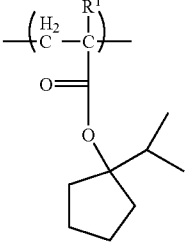

The polymer (A) may contain one or more of the repeating units (a-2). The content of the repeating unit (a-2) in the polymer (A) is preferably about 5 to about 80 mol %, more preferably about 10 to about 80 mol %, and particularly preferably 20 to 70 mol % of the total amount of repeating units forming the polymer (A). If the content of the repeating unit (a-2) is less than about 5 mol %, pattern falling resistance of the resist may decrease. If the content of the repeating unit (a-2) is more than about 80 mol %, the adhesion of a resist film may decrease, which may induce pattern falling and pattern peeling.

In addition to the repeating unit (a-1) and the repeating unit (a-2), the polymer preferably contains a repeating unit (a-3) including a cyclic carbonate structure or a repeating unit (a-4) including a lactone structure.

[1-3] Repeating Unit (a-3)

The repeating unit (a-3) shown by the above formula (a-3) includes a cyclic carbonate structure.

In the above formula (a-3), $R^1$ individually represent a hydrogen atom, a methyl group, or a trifluoromethyl group. Of these groups, a methyl group is preferable. $R^4$ shows a trivalent organic group which specifically includes a trivalent chain-like hydrocarbon group, a group having a trivalent cyclic hydrocarbon structure, and a group having a trivalent heterocyclic structure. These groups may be substituted by a hydroxyl group, a carboxyl group, a cyano group, and the like.

As specific examples of the repeating unit (a-3), repeating units (a-3a) to (a-3v) shown by the following formulas (a-3a) to (a-3v) can be given. Among these, as examples of a group in which $R^4$ in the formula (a-3) is a chain-like hydrocarbon group, the following groups (a-3a) to (a-3f) can be given, as examples of a group having a cyclic hydrocarbon structure, the following groups (a-3g) to (a-3p) can be given, and as examples of a group having a heterocyclic structure, the following groups (a-3q) to (a-3v) can be given.

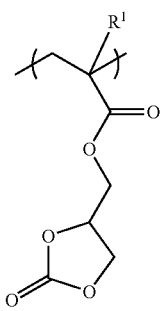

(a-3a)

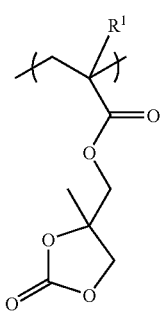

(a-3b)

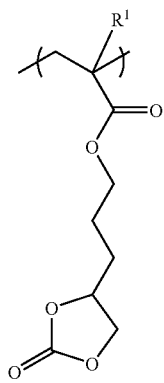

(a-3c)

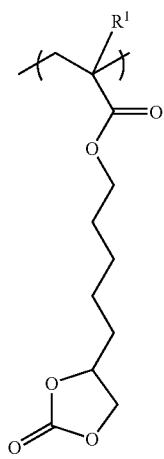

(a-3d)

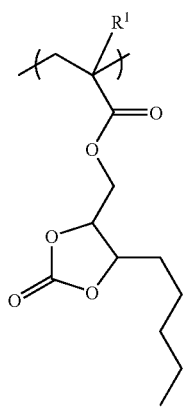

(a-3e)

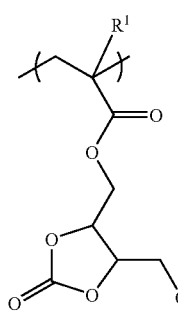

(a-3f)

-continued
(a-3g)
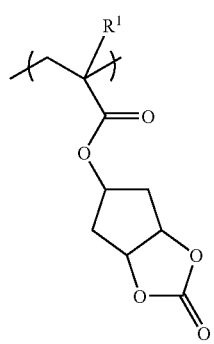
(a-3h)
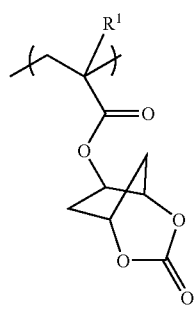
(a-3i)
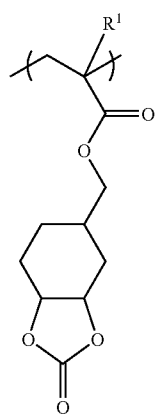
(a-3j)
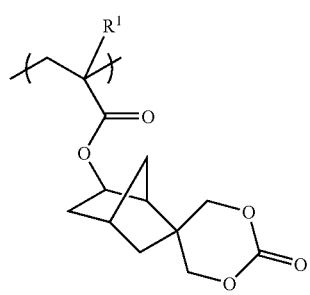
(a-3k)
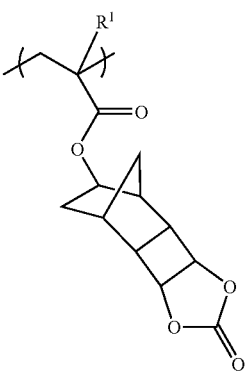
(a-3l)
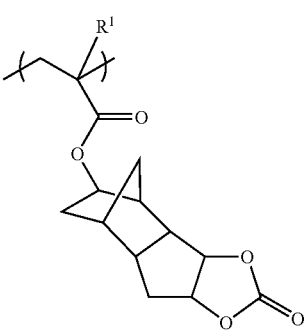
(a-3n)
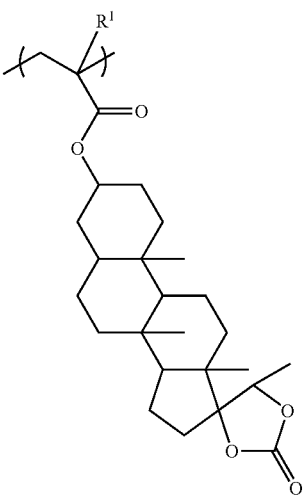
(a-3o)
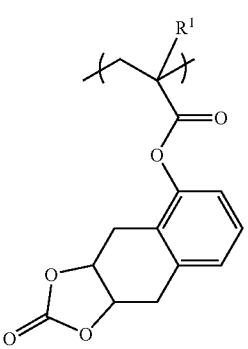

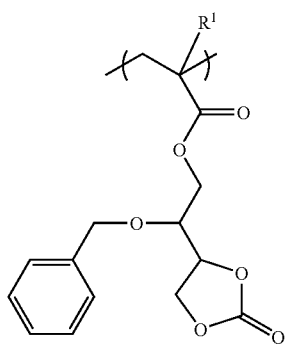 (a-3p)

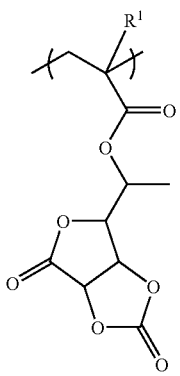 (a-3t)

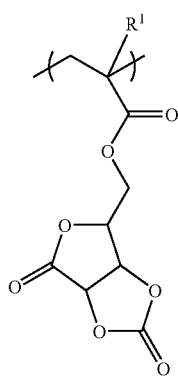 (a-3q)

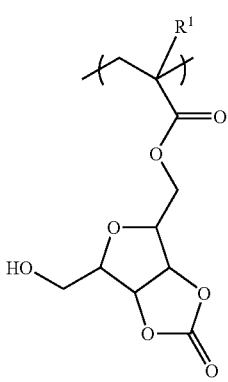 (a-3u)

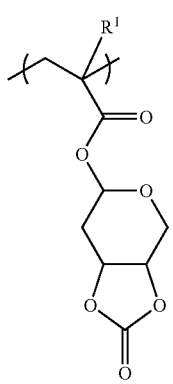 (a-3r)

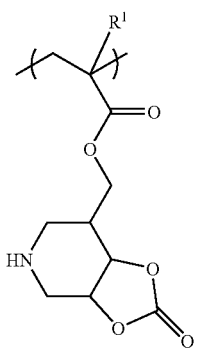 (a-3v)

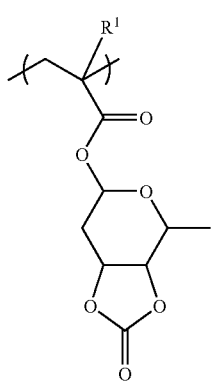 (a-3s)

The monomer providing the repeating unit (a-3) can be synthesized according to a generally known method such as a method described in the Tetrahedron Letters, Vol. 27, No. 32, p. 3741 (1986), the Organic Letters, Vol. 4, No. 15, p. 2561 (2002), and the like.

The polymer (A) may have one or more of the repeating units (a-3). The content of the repeating unit (a-3) in the polymer (A) is preferably about 0 to about 80 mol %, more preferably about 0 to about 70 mol %, and particularly preferably about 0 to about 50 mol % of the total amount of the repeating units forming the polymer (A). If the content of the repeating unit (a-3) is more than about 80 mol %, the developability, LWR, and PEB temperature dependency as a resist may decrease.

[1-4] Repeating Unit (a-4)

As specific examples of the repeating unit (a-4), repeating units (a-4a) to (a-4r) shown by the following formulas (a-4a) to (a-4r) can be given.

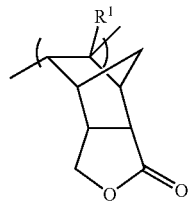
(a-4a)
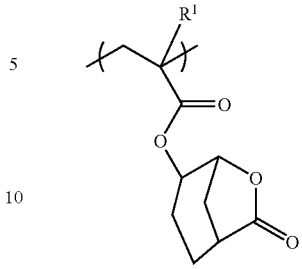
(a-4b)
(a-4f)
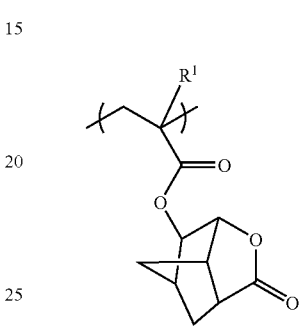
(a-4c)
(a-4g)
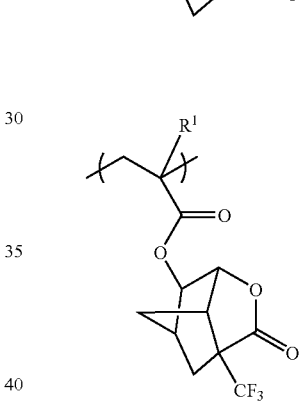
(a-4d)
(a-4h)
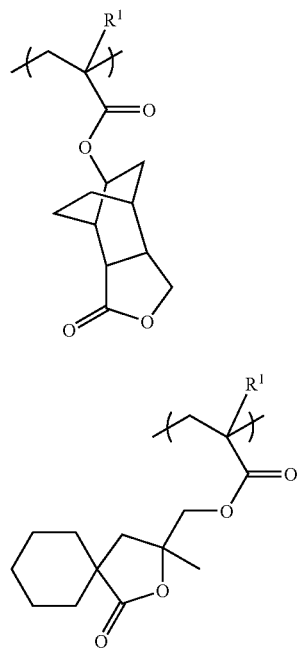
(a-4e)
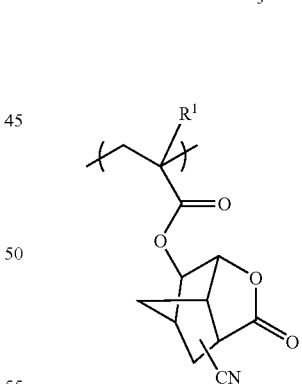
(a-4i)
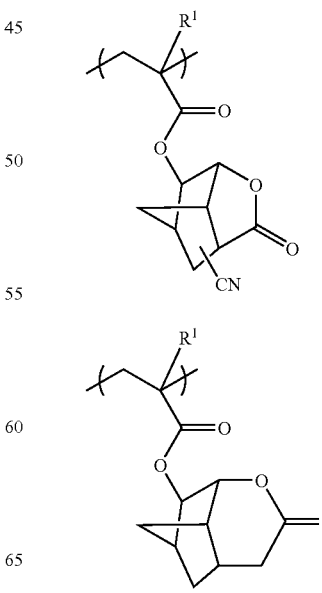
(a-4j)

(a-4k)
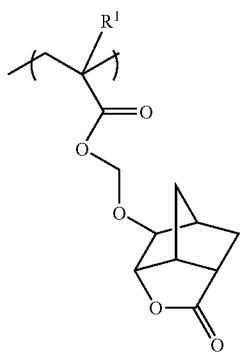

(a-4l)
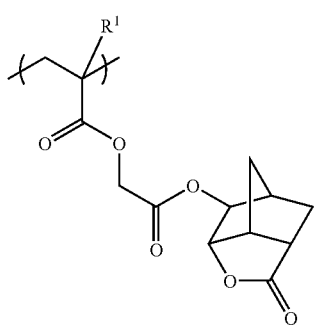

(a-4m)
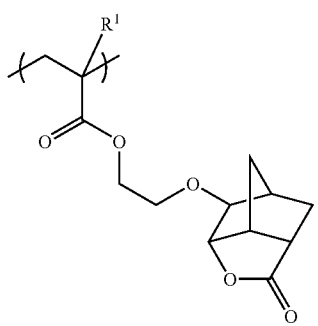

(a-4n)
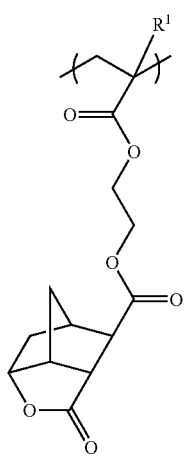

(a-4o)
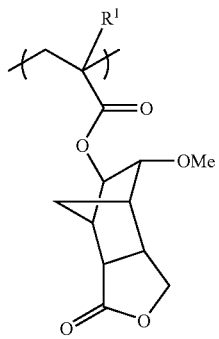

(a-4p)
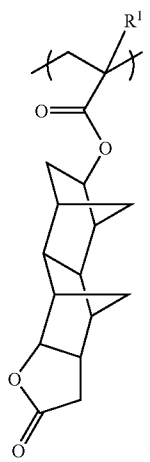

(a-4q)
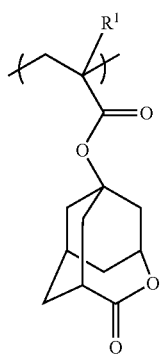

(a-4r)
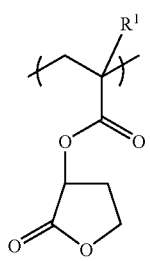

In the above formulas (a-4a) to (a-4r), $R^1$ represents a hydrogen atom, a methyl group, or a trifluoromethyl group.

The repeating unit (a-4) is preferably a unit containing a lactone ring structure bonded to an alicyclic hydrocarbon group. The repeating unit (a-4b) is an example of the repeating unit including a lactone ring bonded to a cyclopentane ring, and the repeating units (a-4e) and (a-4f) are examples of the repeating unit including a lactone ring bonded to a cyclohexane ring.

The repeating unit (a-4) is a unit containing a lactone ring bonded to a polyalicyclic hydrocarbon group. The repeating units (a-4a), (a-4c), (a-4g) to (a-4o) are examples of the repeating unit including a lactone ring bonded to a norbornene ring, and the repeating unit (a-4d) is an example of the repeating unit including a bicyclo[2.2.2]octane ring.

Among these units, a repeating unit shown by the following formula (a-4'), to which above repeating units (a-4g) to (a-4n) correspond, is preferable.

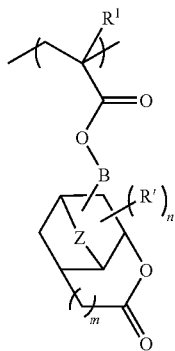

(a-4')

In the formula (a-4'), $R^1$ represents a hydrogen atom, a methyl group, or a trifluoromethyl group, $R^1$ represents a hydroxyl group, a carboxyl group, a methyl group, a methoxy group, or a cyano group, B represents a single bond, a divalent hydrocarbon group having 1 to 3 carbon atoms, or a group —R''—Y— (wherein R'' represents a divalent hydrocarbon group having 1 to 3 carbon atoms and Y represents —O—, —COO—, or —OCO—), Z represents an oxygen atom or a methylene group, m represents 0 or 1 and n represents an integer from 0 to 3.

As examples of a monomer providing the repeating unit (a-4), 5-oxo-4-oxa-tricyclo[4.2.1.0$^{3,7}$]non-2-yl(meth)acrylate, 9-methoxycarbonyl-5-oxo-4-oxa-tricyclo[4.2.1.0$^{3,7}$]non-2-yl(meth)acrylate, 5-oxo-4-oxa-tricyclo[5.2.1.0$^{3,8}$]dec-2-yl(meth)acrylate, 10-methoxycarbonyl-5-oxo-4-oxatricyclo[5.2.1.0$^{3,8}$]non-2-yl(meth)acrylate, 6-oxo-7-oxa-bicyclo[3.2.1]oct-2-yl(meth)acrylate, 4-methoxycarbonyl-6-oxo-7-oxa-bicyclo[3.2.1]oct-2-yl(meth)acrylate, 7-oxo-8-oxa-bicyclo[3.3.1]oct-2-yl(meth)acrylate, 4-methoxycarbonyl-7-oxo-8-oxa-bicyclo[3.3.1]oct-2-yl(meth)acrylate, 2-oxo-tetrahydropyran-4-yl(meth)acrylate, 4-methyl-2-oxo-tetrahydropyran-4-yl(meth)acrylate, 4-ethyl-2-oxo-tetrahydropyran-4-yl(meth)acrylate, 4-propyl-2-oxo-tetrahydropyran-4-yl(meth)acrylate, 5-oxo-tetrahydrofuran-3-yl(meth)acrylate, 2,2-dimethyl-5-oxo-tetrahydrofuran-3-yl(meth)acrylate, 4,4-dimethyl-5-oxo-tetrahydrofuran-3-yl(meth)acrylate, 2-oxo-tetrahydrofuran-3-yl(meth)acrylate, 4,4-dimethyl-2-oxo-tetrahydrofuran-3-yl(meth)acrylate, 5,5-dimethyl-2-oxo-tetrahydrofuran-3-yl(meth)acrylate, 2-oxo-tetrahydrofuran-3-yl(meth)acrylate, methyl 5-oxo-tetrahydrofuran-2-yl(meth)acrylate, methyl 3,3-dimethyl-5-oxo-tetrahydrofuran-2-yl(meth)acrylate, and methyl 4,4-dimethyl-5-oxo-tetrahydrofuran-2-yl(meth)acrylate can be given.

The polymer (A) may have one or more of the repeating units (a-4). The content of the repeating unit (a-4) in the polymer (A) is preferably about 0 to about 90 mol %, more preferably about 10 to about 80 mol %, and particularly preferably about 15 to about 70 mol % of the total amount of repeating units forming the polymer (A). If the content of the repeating unit (a-4) is more than about 90 mol %, the developability, LWR, and PEB temperature dependency as a resist may decrease.

[1-5] Repeating Unit (a-6)

In addition to the repeating unit (a-1), the polymer (A) preferably contains a repeating unit (a-6) having a polycyclic cycloalkyl group in the structure shown by the following formula (a-6),

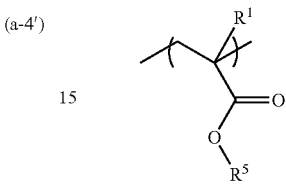

(a-6)

wherein $R^1$ represents a hydrogen atom, a methyl group, or a trifluoromethyl group, and $R^5$ represents a polycyclic cycloalkyl group having 7 to 20 carbon atoms.

As examples of the polycyclic cycloalkyl group having 7 to 20 carbon atoms represented by $R^5$ in the formula (a-6), a cycloalkyl group having a polycyclic structure such as bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, and tricyclo[3.3.1.1$^{3,7}$]decane can be given.

At least one hydrogen atom in these polycyclic cycloalkyl groups may be substituted by at least one substituent selected from the group consisting of an alkyl group having 1 to 4 carbon atoms, a cycloalkyl group having 3 to 12 carbon atoms, a hydroxyl group, a cyano group, a hydroxyalkyl group having 1 to 10 carbon atoms, and a carboxyl group.

As examples of an alkyl group having 1 to 4 carbon atoms, a linear alkyl group having 1 to 4 carbon atoms such as a methyl group, an ethyl group, an n-propyl group, an n-butyl group, a 2-methylpropyl group, a 1-methylpropyl group, and a t-butyl group; a branched alkyl group having 3 to 4 carbon atoms such as an i-propyl group, a 2-methylpropyl group, a 1-methylpropyl group, and a t-butyl group; and the like can be given. As examples of the cycloalkyl group having 3 to 12 carbon atoms, a cyclopropyl group, a cyclohexyl group, a cyclooctyl group, and a cyclododecyl group can be given.

As examples of a monomer providing the repeating unit (a-6), bicyclo[2.2.1]heptyl(meth)acrylate, cyclohexyl(meth)acrylate, bicyclo[4.4.0]decanyl(meth)acrylate, bicyclo[2.2.2]octyl(meth)acrylate, tricyclo[5.2.1.0$^{2,6}$]decanyl(meth)acrylate, tetracyclo[6.2.1.1$^{3,6}$.0$^{2,7}$]dodecanyl(meth)acrylate, and tricyclo[3.3.1.1$^{3,7}$]decanyl(meth)acrylate can be given.

The polymer (A) may have one or more of the repeating units (a-6). The content of the repeating unit (a-6) in the polymer (A) is preferably about 0 to about 30 mol %, and more preferably about 0 to about 25 mol % of the total amount of repeating units forming the polymer (A). If the content of the repeating unit (a-6) is more than 30 mol %, the resist film tends to be swollen by an alkaline developer or developability as a resist may decrease.

[1-6] Repeating Unit (a-7)

In addition to the repeating unit (a-1), the polymer (A) preferably contains a repeating unit (a-7) having a carbon atom to which two trifluoromethyl groups and one hydroxyl group are bonded in the structure which is shown by the following formula (a-7),

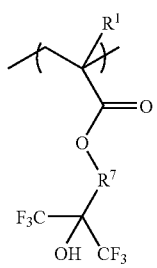

(a-7)

wherein $R^6$ represents a hydrogen atom, an alkyl group having 1 to 4 carbon atoms, a trifluoromethyl group, or a hydroxylmethyl group, and $R^7$ represents a divalent chain-like hydrocarbon group or a divalent cyclic hydrocarbon group.

As examples of the divalent chain-like hydrocarbon group represented by $R^7$ in the formula (a-7), a linear alkylene group such as a methylene group, an ethylene group, a 1,2-propylene group, a 1,3-propylene group, a tetramethylene group, a pentamethylene group, a hexamethylene group, a heptamethylene group, an octamethylene group, a nonamethylene group, a decamethylene group, an undecamethylene group, a dodecamethylene group, a tridecamethylene group, a tetradecamethylene group, a pentadecamethylene group, a hexadecamethylene group, a heptadecamethylene group, an octadecamethylene group, a nonadecamethylene group, and an icosylene group; a branched alkylene group such as a 1-methyl-1,3-propylene group, a 2-methyl-1,3-propylene group, a 2-methyl-1,2-propylene group, a 1-methyl-1,4-butylene group, a 2-methyl-1,4-butylene group, a methylidene group, an ethylidene group, a propylidene group, and a 2-propylidene group; and the like can be given.

As examples of the divalent cyclic hydrocarbon group, a monocyclic cycloalkylene group having 3 to 10 carbon atoms such as a 1,3-cyclobutylene group, 1,3-cyclopentylene group, a 1,4-cyclohexylene group, and a 1,5-cyclooctylene group; a polycyclic cycloalkylene group such as a 1,4-norbornylene group, a 2,5-norbornylene group, a 1,5-admantylene group, and a 2,6-admantylene group; and the like can be given.

The divalent chain-like hydrocarbon group and the divalent cyclic hydrocarbon group may contain atoms other than a carbon atoms and a hydrogen atom. For example, an alkylene glycol group, an alkylene ester group, and the like are included in the divalent chain-like hydrocarbon group.

As preferable examples of monomers providing the repeating unit (a-7), (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl}(meth)acrylate, and the like can be given.

The polymer (A) may have one or more of the repeating units (a-7). The content of the repeating unit (a-7) in the polymer (A) is preferably about 0 to about 30 mol %, and more preferably about 0 to about 25 mol % of the total amount of repeating units forming the polymer (A). If the content of the repeating unit (a-7) is more than 30 mol %, a top loss of the resist pattern may be produced, giving rise to the possibility of impairing the pattern shape.

[1-7] Repeating Unit (a-8)

In addition to the repeating unit (a-1), the polymer (A) preferably contains a repeating unit (a-8) having an adamantane ring structure in the structure shown by the following formula (a-8),

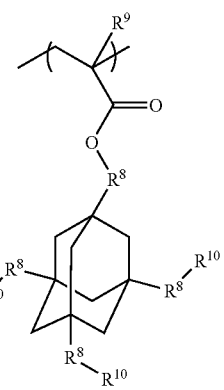

(a-8)

wherein $R^9$ represents a hydrogen atom or a methyl group, $R^8$ individually represent a single bond, a methylene group, or a divalent alkylene group having 2 or 3 carbon atoms, and $R^{10}$ individually represent a hydrogen atom, a hydroxyl group, a cyano group, or a $COOR^{11}$ group, wherein $R^{11}$ represents a hydrogen atom, an alkyl group having 1 to 4 carbon atoms, or a cycloalkyl group having 3 to 20 carbon atoms.

As the divalent alkylene group having 2 or 3 carbon atoms represented by $R^8$ in the formula (a-8), a divalent linear saturated alkylene group such as an ethylene group and a propylene group; and the like can be given.

When an $R^8$ group in the formula (a-8) is a single bond to which an $R^{10}$ group other than a hydrogen atom is bonded, at least one of the other $R^8$ groups is preferably a methylene group or an alkylene group having 2 or 3 carbon atoms.

The alkyl group having 1 to 4 carbon atoms represented by $R^{11}$ in the $COOR^{11}$ group representing $R^{10}$ in the formula (a-8) is preferably a linear or branched alkyl group. Although not particularly limited, the number of carbon atoms in the alkyl group is preferably 1 to 4, and most preferably 2 or 3.

As examples of the cycloalkyl group having 3 to 20 carbon atoms, a monocyclic alkyl group represented by $-C_qH_{2q+1}$ (wherein q is an integer from 3 to 20) such as a cyclopropyl group, a cyclobutyl group, a cyclopentyl group, a cyclohexyl group, a cycloheptyl group, and a cyclooctyl group; a polycyclic alkyl group such as a bicyclo[2.2.1]heptyl group, a tricyclo[5.2.1.0$^{2,6}$]decyl group, a tetracyclo[6.2.1.1$^{3,6}$.0$^{2,7}$]dodecanyl group, and an adamantyl group; a group in which one or more hydrogen atoms in these groups are substituted by an alkyl group or a cycloalkyl group; and the like can be given.

As preferable examples of a monomer providing the repeating unit (a-8), 3-hydroxyadamantan-1-ylmethyl(meth)acrylate, 3,5-dihydroxyadamantan-1-ylmethyl(meth)acrylate, 3-hydroxy-5-methyladamantan-1-yl(meth)acrylate, 3,5-dihydroxy-7-methyladamantan-1-yl(meth)acrylate, 3-hydroxy-5,7-dimethyladamantan-1-yl(meth)acrylate, and 3-hydroxy-5,7-dimethyladamantan-1-ylmethyl acrylate can be given.

The polymer (A) may have one or more of the repeating units (a-8). The content of the repeating unit (a-8) in the polymer (A) is preferably about 0 to about 30 mol %, and more preferably about 0 to about 25 mol % of the total amount of repeating units forming the polymer (A). If the content of the repeating unit (a-8) is more than 30 mol %, the resist film tends to be swollen by an alkaline developer or developability as a resist may decrease.

[1-8] Repeating Unit (a-9)

In order to have a desired function, the polymer (A) may further have a repeating unit (a-9) other than the repeating units (a-1) to (a-8).

Examples of the repeating unit (a-9) include units obtainable by cleavage of a polymerizable unsaturated bond of a polyfunctional monomer such as (meth)acrylates having a bridged hydrocarbon skeleton such as dicyclopentenyl(meth)acrylate and methyl adamantyl(meth)acrylate; carboxyl group-containing esters having a bridged hydrocarbon skeleton of unsaturated carboxylic acid such as carboxynorbornyl (meth)acrylate, carboxytricyclodecanyl(meth)acrylate, and carboxytetracycloundecanyl(meth)acrylate; (meth)acrylates not having a bridged hydrocarbon skeleton such as methyl (meth)acrylate, ethyl(meth)acrylate, n-propyl(meth)acrylate, n-butyl(meth)acrylate, 2-methylpropyl(meth)acrylate, 1-methylpropyl(meth)acrylate, t-butyl(meth)acrylate, 2-hydroxyethyl(meth)acrylate, 2-hydroxypropyl(meth)acrylate, 3-hydroxypropyl(meth)acrylate, cyclopropyl(meth)acrylate, cyclopentyl(meth)acrylate, cyclohexyl(meth)acrylate, 4-methoxycyclohexyl(meth)acrylate, 2-cyclopentyloxycarbonylethyl(meth)acrylate, 2-cyclohexyloxycarbonylethyl(meth)acrylate, and 2-(4-methoxycyclohexyl)oxycarbonylethyl(meth)acrylate; α-hydroxymethylacrylates such as methyl α-hydroxymethyl acrylate, ethyl α-hydroxymethyl acrylate, n-propyl α-hydroxymethyl acrylate, and n-butyl-α-hydroxymethyl acrylate; unsaturated nitryl compounds such as (meta)acrylonitrile, α-chloroacrylonitrile, crotonitrile, maleinitrile, fumarnitrile, mesaconitrile, citraconitrile, and itaconitrile; unsaturated amide compounds such as (meth)acrylamide, N,N-dimethyl(meth)acrylamide, crotonamide, maleinamide, fumaramide, mesaconamide, citraconamide, and itaconamide; other nitrogen-containing vinyl compounds such as N-(meth)acryloylmorpholine, N-vinyl-epsilon-caprolactam, N-vinylpyrrolidone, vinylpyridine, and vinylimidazole; unsaturated carboxylic acid (anhydride) such as (meth)acrylic acid, crotonic acid, maleic acid, maleic anhydride, fumaric acid, itaconic acid, itaconic anhydride, citraconic acid, citraconic anhydride, and mesaconic acid; carboxyl group-containing esters having no bridged hydrocarbon skeleton of unsaturated carboxylic acid such as 2-carboxyethyl(meth)acrylate, 2-carboxypropyl(meth)acrylate, 3-carboxypropyl(meth)acrylate, 4-carboxybutyl (meth) acrylate, and 4-carboxycyclohexyl(meth)acrylate; polyfunctional monomers having a bridged hydrocarbon skeleton such as 1,2-adamantanediol di(meth)acrylate, 1,3-adamantanediol di(meth)acrylate, 1,4-adamantanediol di(meth)acrylate, and tricyclodecanyl dimethylol di(meth)acrylate; polyfunctional monomers having no bridged hydrocarbon skeleton such as methylene glycol di(meth)acrylate, ethylene glycol di(meth) acrylate, propylene glycol di(meth)acrylate, 1,6-hexanediol di(meth)acrylate, 2,5-dimethyl-2,5-hexanediol di(meth) acrylate, 1,8-octanediol di(meth)acrylate, 1,9-nonanediol di(meth)acrylate, 1,4-bis(2-hydroxypropyl)benzene di(meth)acrylate, and 1,3-bis(2-hydroxypropyl)benzene di(meth)acrylate.

The content of the repeating unit (a-9) in the polymer (A) is preferably about 0 to about 50 mol %, and more preferably about 0 to about 40 mol % of the total amount of repeating units forming the polymer (A).

[1-9] Production Method

Next, a method for producing the polymer (A) will be described.

The copolymer (A) can be synthesized by a general method such as radical polymerization. For example, (1) a method of polymerizing a monomer by dropping a solution containing the monomer and a radical initiator into a solution containing a reaction solvent or the monomer, (2) a method of polymerizing a monomer by dropping a solution containing the monomer and a solution containing a radical initiator into a solution containing a reaction solvent or the monomer, (3) a method of polymerizing two or more types of monomers by dropping two or more solutions each containing a different type of monomer and a solution containing a radical initiator into a solution containing a reaction solvent or the monomer; and the like can be given.

When dropping a monomer solution to another monomer solution, the amount of monomer in the former solution (monomer solution to be added) is preferably 30 mol % or more, more preferably 50 mol % or more, and particularly preferably 70 mol % or more of the total amount of the monomer used for the polymerization.

The polymerization reaction temperature is appropriately determined according to the type of initiator used. Such a temperature is usually about 30 to about 180° C., preferably about 40 to about 160° C., and more preferably about 50 to about 140° C. The period of dropping (dropping time) varies according to the reaction temperature, the type of initiator, the type of monomers, and the like, but is usually about 30 minutes to about 8 hours, preferably about 45 minutes to about 6 hours, and more preferably about 1 to about 5 hours. The total reaction time including the dropping time also varies according to the same conditions as the dropping time, and is usually about 30 minutes to about 8 hours, preferably about 45 minutes to about 7 hours, and more preferably about 1 to about 6 hours.

As examples of a radical initiator used for the polymerization, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis-iso-butylonitrile, 2,2'-azobis(2-methylbutyronitrile), 1,1'-azobis(cyclohexane-1-carbonitrile), 2,2'-azobis(2-methyl-N-phenylpropioneamidine)dihydrochloride, 2,2'-azobis(2-methyl-N-2-propenylpropioneamidine)dihydrochloride, 2,2'-azobis[2-(5-methyl-2-imidazolin-2-yl)propane]dihydrochloride, 2,2'-azobis{2-methyl-N-[1,1-bis(hydroxymethyl)-2-hydroxyethyl]propioneamide}, dimethyl-2,2'-azobis(2-methylpropionate), 4,4'-azobis(4-cyanovaleric acid), and 2,2'-azobis[2-(hydroxymethyl)propionitrile] can be given. These initiators may be used either individually or in a combination of two or more.

As a polymerization solvent, any solvent other than those hindering the polymerization (e.g. nitrobenzene having a polymerization prohibition effect, a mercapto compound having a chain transfer effect, etc.) and being capable of dissolving the monomers can be used. As examples, an alcohol solvent, an ether solvent, a ketone solvent, an amide solvent, an ester-lactone solvent, a nitrile solvent, and a mixture of these solvents can be given.

As examples of the alcohol solvent, methanol, ethanol, propanol, isopropanol, butanol, ethylene glycol, propylene glycol, ethylene glycol monomethyl ether, ethylene glycol monoethyl ether, and 1-methoxy-2-propanol can be given. Examples of the ether solvent include propyl ether, isopropyl ether, butyl methyl ether, tetrahydrofuran, 1,4-dioxane, 1,3-dioxolane, and 1,3-dioxane.

As examples of the ketone solvent, acetone, methyl ethyl ketone, diethyl ketone, methyl isopropyl ketone, methyl isobutyl ketone, and the like can be given. As examples of the amide solvent, N,N-dimethylformamide, N,N-dimethylacetamide, and the like can be given. As examples of the ester-lactone solvent, ethyl acetate, methyl acetate, isobutyl acetate, γ-butyrolactone, and the like can be given. As examples of the nitrile solvent, acetonitrile, propionitrile, butyronitrile, and the like can be given. These solvents may be used either individually or in a combination of two or more.

The polymer obtained by the polymerization reaction is preferably recovered by a reprecipitation method. Specifically, after the polymerization reaction, the polymer solution is added to a solvent for reprecipitation to collect the target polymer as a powder. As a reprecipitation solvent, the solvent mentioned above as a polymerization solvent may be used either individually or in a combination of two or more.

The content of a low molecular weight component derived from monomers in the polymer (A) is preferably 0.1 mass % or less, more preferably 0.07 mass % or less, and particularly preferably 0.05 mass % or less.

The polystyrene-reduced weight average molecular weight (hereinafter abbreviated as "Mw") of the polymer (A) measured by gel permeation chromatography (GPC) is preferably from about 1000 to about 100,000, more preferably about 1000 to about 30,000, and particularly preferably about 1000 to about 20,000. If Mw of the polymer (A) is less than 1000, the heat resistance as a resist tends to decrease. If Mw of the polymer (A) is more than 100,000, developability of a resist tends to decrease.

The ratio of Mw to Mn, which is a polystyrene-reduced number average molecular weight (hereinafter abbreviated as "Mn") of the polymer (A) measured by gel permeation chromatography (GPC), is usually about 1.0 to about 5.0, preferably about 1.0 to about 3.0, and more preferably about 1.0 to about 2.0.

Either one polymer (A) or a mixture of two or more polymers (A) may be used in the resin composition of the embodiment of the present invention.

[2] Acid Generator (B)

The acid generator (B) is a radiation-sensitive component which generates an acid by exposure to radiation. The acid generator causes the acid-dissociable group in the polymer (A) which is contained in the radiation-sensitive resin composition to dissociate (by causing a protective group to dissociate) by the action of an acid generated upon exposure and causes the polymer (A) to become alkali soluble. As a result, the exposed area on the resist film is rendered soluble in an alkaline developer to form a positive-tone resist pattern.

The acid generator (B) preferably used in this embodiment includes a compound shown by the following formula (B-1),

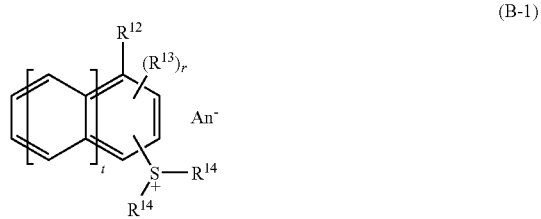

(B-1)

wherein $R^{12}$ represents a hydrogen atom, a fluorine atom, a hydroxyl group, an alkyl group having 1 to 10 carbon atoms, an alkoxyl group having 1 to 10 carbon atoms, or an alkoxycarbonyl group having 2 to 11 carbon atoms, $R^{13}$ represents an alkyl group having 1 to 10 carbon atoms, an alkoxyl group having 1 to 10 carbon atoms, or an alkane sulfonyl group having 1 to 10 carbon atoms, and $R^{14}$ individually represent an alkyl group having 1 to 10 carbon atoms, a phenyl group or a naphthyl group, or two $R^{14}$ groups bonded to each other to form a divalent group having 2 to 10 carbon atoms, t represents an integer from 0 to 2, r represents an integer from 0 to 10, and An⁻ represents an anion shown by one of the following formulas (b-1) to (b-4),

(b-1)

(b-2)

wherein $R^{15}$ represents a hydrogen atom, a fluorine atom, a hydrocarbon group having 1 to 12 carbon atoms, and s represents an integer from 1 to 10,

(b-3)

(b-4)

wherein $R^{16}$ individually represent a fluoroalkyl group having 1 to 10 carbon atoms, or two $R^{16}$ groups bonded to each other to form a divalent fluoroalkylene group having 2 to 10 carbon atoms.

As examples of the alkyl group having 1 to 10 carbon atoms represented by $R^{12}$, $R^{13}$, and $R^{14}$ in the formula (B-1), in addition to the previously-mentioned alkyl group having 1 to 4 carbon atoms, a linear alkyl group such as an n-pentyl group, an n-hexyl group, an n-heptyl group, an n-octyl group, an n-nonyl group, and an n-decyl group; a branched alkyl group such as a neopentyl group and a 2-ethylhexyl group; and the like can be given. Of these, a methyl group, an ethyl group, an n-butyl group, a t-butyl group, and the like are preferable.

As examples of the alkoxyl group having 1 to 10 carbon atoms represented by $R^{12}$ and $R^{13}$, a linear alkoxyl group such as a methoxy group, an ethoxy group, an n-propoxy group, an n-butoxy group, an n-pentyloxy group, an n-hexyloxy group, an n-heptyloxy group, an n-octyloxy group, an n-nonyloxy group, and an n-decyloxy group; a branched alkoxyl group such as an i-propoxy group, a 2-methylpropoxy group, a 1-methylpropoxy group, a t-butoxy group, a neopentyloxy group, and a 2-ethylhexyloxy group; and the like can be given. Of these, a methoxy group, an ethoxy group, an n-propoxy group, an n-butoxy group, and the like are preferable.

As examples of the alkoxycarbonyl group having 2 to 11 carbon atoms represented by $R^{12}$, a linear alkoxycarbonyl group such as a methoxycarbonyl group, an ethoxycarbonyl group, an n-propoxycarbonyl group, an n-butoxycarbonyl group, an n-pentyloxycarbonyl group, an n-hexyloxycarbonyl group, an n-heptyloxycarbonyl group, an n-octyloxycarbonyl group, an n-nonyloxycarbonyl group, and an n-decyloxycarbonyl group; a branched alkoxycarbonyl group such as an i-propoxycarbonyl group, a 2-methylpropoxycarbonyl group, a 1-methylpropoxycarbonyl group, a t-butoxycarbonyl group, a neopentyloxycarbonyl group, and a 2-ethylhexyloxycarbonyl group; and the like can be given. Of these, a methoxycarbonyl group, an ethoxycarbonyl group, an n-butoxycarbonyl group, and the like are preferable.

As examples of the alkanesulfonyl group having 1 to 10 carbon atoms represented by $R^{13}$, a linear alkanesulfonyl group such as a methanesulfonyl group, an ethanesulfonyl group, an n-propanesulfonyl group, an n-butanesulfonyl group, an n-pentanesulfonyl group, an n-hexanesulfonyl group, an n-heptanesulfonyl group, an n-octanesulfonyl group, an n-nonanesulfonyl group, and an n-decanesulfonyl group; a branched alkanesulfonyl group such as a tert-butanesulfonyl group, a neopentanesulfonyl group, and a 2-ethylhexanesulfonyl group; a cycloalkanesulfonyl group such as a cyclopentanesulfonyl group and a cyclohexanesulfonyl group; and the like can be given. Of these, a methanesulfonyl group, an ethanesulfonyl group, an n-propanesulfonyl group, an n-butanesulfonyl group, a cyclopentanesulfonyl group, and a cyclohexanesulfonyl group are preferable.

In the formula (B-1), r is preferably an integer from 0 to 2.

As examples of the phenyl group represented by $R^{14}$ in the formula (B-1), in addition to a phenyl group, a substituted phenyl group such as an o-tolyl group, an m-tolyl group, a p-tolyl group, a 2,3-dimethylphenyl group, a 2,4-dimethylphenyl group, a 2,5-dimethylphenyl group, a 2,6-dimethylphenyl group, a 3,4-dimethylphenyl group, a 3,5-dimethylphenyl group, a 2,4,6-trimethylphenyl group, a 4-ethylphenyl group, a 4-t-butylphenyl group, 4-cyclohexylphenyl group, and a 4-fluorophenyl group; a group obtained by substituting a hydrogen atom in these groups by at least one group selected from a hydroxyl group, a carboxyl group, a cyano group, a nitro group, an alkoxyl group, an alkoxyalkyl group, an alkoxycarbonyl group, and an alkoxycarbonyloxy group; and the like can be given.

As examples of the alkoxyl group as a substituent for a phenyl group or a substituted phenyl group, a linear alkoxyl group such as a methoxy group, an ethoxy group, an n-propoxy group, and an n-butoxy group; a branched alkoxyl group such as an i-propoxy group, a 2-methylpropoxy group, a 1-methylpropoxy group, and a t-butoxy group; and a cycloalkyloxy group such as a cyclopentyloxy group and cyclohexyloxy group; and the like can be given. The number of carbon atoms in these groups is preferably 1 to 20.

Examples of the alkoxyalkyl group include a linear alkoxyalkyl group such as a methoxymethyl group, an ethoxymethyl group, a 2-methoxyethyl group, and a 2-ethoxyethyl group; a branched alkoxyalkyl group such as a 1-methoxyethyl group and a 1-ethoxyethyl group; an alkoxyalkyl group having a cycloalkane structure; and the like. The number of carbon atoms in these groups is preferably 1 to 20.

Examples of the alkoxycarbonyl group include a linear alkoxycarbonyl group such as a methoxycarbonyl group, an ethoxycarbonyl group, an n-propoxycarbonyl group, and n-butoxycarbonyl group; a branched alkoxycarbonyl group such as an i-propoxycarbonyl group, a 2-methylpropoxycarbonyl group, a 1-methylpropoxycarbonyl group, and a t-butoxycarbonyl group; a cycloalkoxycarbonyl group such as a cyclopentyloxycarbonyl group and a cyclohexyloxycarbonyl group; and the like. The number of carbon atoms in these groups is preferably 2 to 21.

Examples of the alkoxycarbonyloxy group include a linear alkoxycarbonyloxy group such as a methoxycarbonyloxy group, an ethoxycarbonyloxy group, an n-propoxycarbonyloxy group, and an n-butoxycarbonyloxy group; a branched alkoxycarbonyloxy group such as an i-propoxycarbonyloxy group and a t-butoxycarbonyloxy group; a cycloalkoxycarbonyl group such as a cyclopentyloxycarbonyl group and a cyclohexyloxycarbonyl group; and the like. The number of carbon atoms in these groups is preferably 2 to 21.

As examples of the phenyl group represented by $R^{14}$, a phenyl group, a 4-cyclohexylphenyl group, a 4-t-butylphenyl group, a 4-methoxyphenyl group, a 4-t-butoxyphenyl group, and the like can be given.

As examples of the naphthyl group represented by $R^{14}$, in addition to a 1-naphthyl group, a substituted naphthyl group such as a 2-methyl-1-naphthyl group, a 3-methyl-1-naphthyl group, a 4-methyl-1-naphthyl group, a 5-methyl-1-naphthyl group, a 6-methyl-1-naphthyl group, a 7-methyl-1-naphthyl group, a 8-methyl-1-naphthyl group, a 2,3-dimethyl-1-naphthyl group, a 2,4-dimethyl-1-naphthyl group, a 2,5-dimethyl-1-naphthyl group, a 2,6-dimethyl-1-naphthyl group, a 2,7-dimethyl-1-naphthyl group, a 2,8-dimethyl-1-naphthyl group, a 3,4-dimethyl-1-naphthyl group, a 3,5-dimethyl-1-naphthyl group, a 3,6-dimethyl-1-naphthyl group, a 3,7-dimethyl-1-naphthyl group, a 3,8-dimethyl-1-naphthyl group, a 4,5-dimethyl-1-naphthyl group, a 5,8-dimethyl-1-naphthyl group, a 4-ethyl-1-naphthyl group, a 2-naphthyl group, a 1-methyl-2-naphthyl group, a 3-methyl-2-naphthyl group, and a 4-methyl-2-naphthyl group, as well as a group obtained by substituting one or more hydrogen atoms in these groups by a hydroxyl group, a carboxyl group, a cyano group, a nitro group, an alkoxyl group, an alkoxyalkyl group, an alkoxycarbonyl group, or an alkoxycarbonyloxy group can be given.

As specific examples of the alkoxy group, alkoxyalkyl group, alkoxycarbonyl group, and alkoxycarbonyloxy group which are the substituents for the naphthyl group or the substituted naphthyl group, the groups illustrated in the section of the phenyl group can be given.

As the naphthyl group represented by $R^{14}$, a 1-naphthyl group, a 1-(4-methoxynaphthyl) group, a 1-(4-ethoxynaphthyl) group, a 1-(4-n-propoxynaphthyl) group, a 1-(4-n-butoxynaphthyl) group, a 2-(7-methoxynaphthyl) group, a 2-(7-ethoxynaphthyl) group, a 2-(7-n-propoxynaphthyl) group, a 2-(7-n-butoxynaphthyl) group, and the like are preferable.

As the divalent group having 2 to 10 carbon atoms formed by bonding of the two $R^{14}$ groups, a structure forming a 5 or 6 member ring together with the sulfur atom in the formula (B-1), particularly preferably a 5 member ring (i.e. tetrahydrothiophene ring) can be given.

The hydrogen atoms in the divalent group may be substituted by at least one group selected from the group consisting of a hydroxyl group, a carboxyl group, a cyano group, a nitro group, an alkoxyl group, an alkoxyalkyl group, an alkoxycarbonyl group, and an alkoxycarbonyloxy group. Some hydrogen atoms may be substituted. As examples of the alkoxyl group, alkoxyalkyl group, alkoxycarbonyl group, and alkoxycarbonyloxy group, those given in the section of the phenyl group can be given.

As the $R^{14}$ group, a methyl group, an ethyl group, a phenyl group, a 4-methoxyphenyl group, a 1-naphthyl group, and a structure formed from two $R^{14}$ groups bonded each other together with the sulfur atom in the formula (B-1) to form a tetrahydrothiophene ring are preferable.

As examples of a preferable cation moiety in the formula (B-1), triphenylsulfonium cation, tri-1-naphthylsulfonium cation, tri-tert-butylphenylsulfonium cation, 4-fluorophenyl-diphenylsulfonium cation, di-4-fluorophenyl-phenylsulfonium cation, tri-4-fluorophenylsulfonium cation, 4-cyclohexylphenyl-diphenylsulfonium cation, 4-methanesulfonylphenyl-diphenylsulfonium cation, 4-cyclohexanesulfonyl-diphenylsulfonium cation, 1-naphthyldimethylsulfonium cation, 1-naphthyldiethylsulfonium cation, 1-(4-hydroxynaphthyl)dimethylsulfonium cation, 1-(4-methylnaphthyl)dimethylsulfonium cation, 1-(4-methylnaphthyl)diethylsulfonium cation, 1-(4-cyanonaphthyl) dimethylsulfonium cation, 1-(4-cyanonaphthyl)diethylsulfonium cation, 1-(3,5-dimethyl-4-hydroxyphenyl) tetrahydrothiophenium cation, 1-(4-methoxynaphthyl) tetrahydrothiophenium cation, 1-(4-ethoxynaphthyl) tetrahydrothiophenium cation, 1-(4-n-propoxynaphthyl) tetrahydrothiophenium cation, 1-(4-n-butoxynaphthyl) tetrahydrothiophenium cation, 2-(7-methoxy naphthyl) tetrahydrothiophenium cation, 2-(7-ethoxynaphthyl) tetrahydrothiophenium cation, 2-(7-n-propoxynaphthyl) tetrahydrothiophenium cation, 2-(7-n-butoxynaphthyl) tetrahydrothiophenium cation, and the like can be given.

In the formula (b-1), —$C_sF_{2s}$— represents a linear or branched perfluoroalkylene group having s carbon atoms, wherein s is preferably 1, 2, 4, or 8.

As the hydrocarbon group having 1 to 12 carbon atoms represented by $R^{15}$ in the formulas (b-1) and (b-2), an alkyl group, a cycloalkyl group, and a bridged alicyclic hydrocarbon group having not more than 12 carbon atoms are preferable. As specific examples, a methyl group, an ethyl group, an n-propyl group, an i-propyl group, an n-butyl group, a 2-methylpropyl group, a 1-methylpropyl group, a t-butyl group, an n-pentyl group, an neopentyl group, an n-hexyl group, a cyclohexyl group, an n-heptyl group, an n-octyl group, a 2-ethylhexyl group, an n-nonyl group, an n-decyl group, a norbornyl group, a norbornylmethyl group, a hydroxynorbornyl group, an adamantyl group, and the like can be given.

A trifluoromethyl group, a pentafluoroethyl group, a heptafuluoropropyl group, a nonafluorobutyl group, a dodecafluoropentyl group, a perfluorooctyl group, and the like can be given as examples of the fluoroalkyl group having 1 to 10 carbon atoms represented by $R^{16}$ in the formulas (b-3) and (b-4).

A tetrafluoroethylene group, a hexafluoropropylene group, an octafluorobutylene group, a decafluoropentylene group, an undecafluorohexylene group, and the like can be given as examples of the divalent fluoroalkylene group having 2 to 10 carbon atoms formed by bonding of two $R^{16}$ groups.

As a preferable anion moiety in the formula (B-1), a trifluoromethanesulfonate anion, a perfluoro-n-butanesulfonate anion, a perfluoro-n-octanesulfonate anion, a 2-(bicyclo[2.2.1]hept-2-yl)-1,1,2,2-tetrafluoroethanesulfonate anion, a 2-(bicyclo[2.2.1]hept-2-yl)-1,1-difluoroethanesulfonate anion, a 1-adamantylsulfonate anion, and anions shown by the following formulas (b-3a) to (b-3g) can be given.

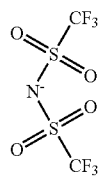

(b-3a)

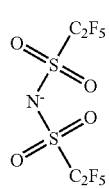

(b-3b)

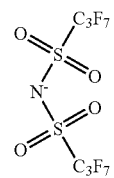

(b-3c)

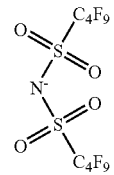

(b-3d)

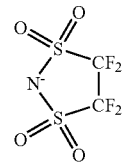

(b-3e)

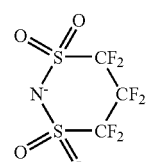

(b-3f)

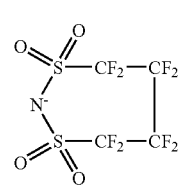

(b-3g)

The acid generator (B) is formed from a combination of a cation and an anion. The combination, however, is not particularly limited. The acid generator (B) can be used either individually or in a combination of two or more in the resin composition of the embodiment of the present invention.

An acid generator other than the acid generator (B) may be used in combination in the resin composition of the embodiment of the present invention. As examples of such an acid generator, an onium salt compound, a halogen-containing compound, a diazoketone compound, a sulfone compound, a sulfonate compound, and the like can be given. Specific examples include the following compounds.

Examples of the onium salt compound include an iodonium salt, a sulfonium salt, a phosphonium salt, a diazonium salt, a pyridinium salt, and the like. Specific examples include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, cyclohexyl•2-oxocyclohexy•methylsulfonium trifluoromethanesulfonate, dicyclohexyl•2-oxocyclohexylsulfonium trifluoromethanesulfonate, 2-oxocyclohexyldimethylsulfonium trifluoromethanesulfonate, and the like.

Examples of the halogen-containing compound include a haloalkyl group-containing hydrocarbon compound, a haloalkyl group-containing heterocyclic compound, and the like. Specific examples include (trichloromethyl)-s-triazine derivatives such as phenylbis(trichloromethyl)-s-triazine, 4-methoxyphenylbis(trichloromethyl)-s-triazine, and 1-naphthylbis(trichloromethyl)-s-triazine; 1,1-bis(4-chlorophenyl)-2,2,2-trichloroethane; and the like.

Examples of the diazoketone compound include a 1,3-diketo-2-diazo compound, a diazobenzoquinone compound, a diazonaphthoquinone compound, and the like. More specifically, 1,2-naphthoquinonediazide-4-sulfonyl chloride, 1,2-naphthoquinonediazide-5-sulfonyl chloride, 2,3,4,4'-tetrahydroxybenzophenone, 1,2-naphthoquinonediazide-4-sulfonate, 1,2-naphthoquinonediazide-5-sulfonate 1,1,1-tris(4-hydroxyphenyl)ethane, 1,2-naphthoquinonediazide-4-sulfonate, 1,2-naphthoquinonediazide-5-sulfonate, and the like can be given.

As examples of the sulfone compound, β-ketosulfone, β-sulfonylsulfone, β-diazo compounds of these sulfones, and the like can be given. More specific examples include 4-trisphenacylsulfone, mesitylphenacylsulfone, bis(phenylsulfonyl)methane, and the like.

As examples of the sulfonic acid compound, an alkyl sulfonate, an alkylimide sulfonate, a haloalkyl sulfonate, an aryl sulfonate, and an imino sulfonate can be given.

More specific examples include, benzointosylate, pyrogallol tris(trifluoromethanesulfonate), nitrobenzyl-9,10-diethoxyanthracene-2-sulfonate, trifluoromethanesulfonylbicyclo[2.2.1]hept-5-ene-2,3-dicarbodiimide, nonafluoro-n-butanesulfonylbicyclo[2.2.1]hept-5-ene-2,3-dicarbodiimide, perfluoro-n-octanesulfonylbicyclo[2.2.1]hept-5-ene-2,3-dicarbodiimide, 2-bicyclo[2.2.1]hepta-2-yl-1,1,2,2-tetrafluoroethanesulfonylbicyclo[2.2.1]hept-5-ene-2,3-dicarbodiimide, N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hepta-2-yl-1,1,2,2-tetrafluoroethanesulfonyloxy)succinimide, 1,8-naphthalenedicarboxylic acid imide trifluoromethanesulfonate, 1,8-naphthalenedicarboxylic acid imide nonafluoro-n-butanesulfonate, 1,8-naphthalenedicarboxylic acid imide perfluoro-n-octanesulfonate, and the like.

These acid generators may be used either individually or in a combination of two or more.

The total amount of the acid generator (B) and other acid generators used in the embodiment of the present invention is usually about 0.1 to about 30 parts by mass, and preferably about 0.5 to about 20 parts by mass for 100 parts by mass of the polymer (A) from the viewpoint of ensuring sensitivity and developability as a resist. If this total amount is less than about 0.1 part by mass, the sensitivity and developability as a resist tend to be impaired. If more than about 30 parts by mass, transparency to radiation tends to decrease, which makes it difficult to obtain a rectangular resist pattern. The proportion of the other acid generators to be added is preferably about 80 mass % or less, and more preferably about 60 mass % or less of the total amount of the acid generator (B) and other acid generators.

[3] Acid Diffusion Controller (C)

In addition to the polymer (A) and the acid generator (B), the radiation-sensitive composition of the embodiment of the present invention further includes an acid diffusion controller (C). The acid diffusion controller controls diffusion of an acid generated by the acid generator upon exposure in a resist film to hinder undesired chemical reactions in the unexposed area. The addition of the acid diffusion controller (C) improves storage stability of the resulting radiation-sensitive resin composition and resolution as a resist and prevents the line width of a resist pattern from changing due to changes in the post-exposure delay (PED) between exposure and post exposure heat treatment, whereby a composition with remarkably superior process stability can be obtained.

A nitrogen-containing compound (C-1) shown by the following formula (C-1) is used as the acid diffusion controller (C) in the radiation-sensitive resin composition of the embodiment of the present invention.

(C-1)

wherein $R^{17}$ and $R^{18}$ individually represent a hydrogen atom, a monovalent chain-like hydrocarbon group having 1 to 20 carbon atoms, a monovalent alicyclic hydrocarbon group having 3 to 20 carbon atoms, or a monovalent aromatic hydrocarbon group having 6 to 20 carbon atoms. The two $R^{17}$ groups may bond each other to form a ring structure.

As a group represented by $R^{18}$ in the formula (C-1), a tert-butyl group or a tert-amyl group are preferable.

The two $R^{17}$ groups in the formula (C-1) may bond each other to form a ring structure. For example, a compound in which the nitrogen atom in the formula (C-1) forms a part of a cyclic amine, such as N-t-butoxycarbonylpyrrolidine and N-t-butoxycarbonyl-2-phenylbenzimidazole, is included in the nitrogen-containing compound (C-1).

Examples of the nitrogen atom shown by the formula (C-1) include N-t-butyl group-containing amino compounds such as N-t-butoxycarbonyl di-n-octylamine, N-t-butoxycarbonyl di-n-nonylamine, N-t-butoxycarbonyl di-n-decylamine, N-t-butoxycarbonyl dicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidine methanol, (R)-(+)-1-(t-butoxycarbonyl)-2-pyrrolidine methanol, N-t-butoxycarbonyl-4-hydroxypiperidine, N-t-butoxycarbonylpyrrolidine, N,N'-di-t-butoxycarbonylpiperazine, N,N-di-t-butoxycarbonyl-1-adamantylamine, N,N'-di-t-butoxycarbonyl-N-methyl-1-adamantylamine, N-t-butoxycarbonyl-4,4'-diaminodiphenylmethane, N,N-di-t-butoxycarbonylhexamethylenediamine, N,N,N'N'-tetra-t-butoxycarbonylhexamethylenediamine, N,N'-di-t-butoxycarbonyl-1,7-diaminoheptane, N,N'-di-t-butoxycarbonyl-1,8-diaminononane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, N-t-butoxycarbonyl-2-phenylbenzimidazole, and the like; and N-t-amyl group-containing amino compounds such as N-t-amyloxycarbonyl di-n-octylamine, N-t-amyloxycarbonyl di-n-nonylamine, N-t-amyloxycarbonyl di-n-decylamine, N-t-amyloxycarbonyl dicyclohexylamine, N-t-amyloxycarbonyl-1-adamantylamine, N-t-amyloxycarbonyl-2-adamantylamine, N-t-amyloxycarbonyl-N-methyl-1-adamantylamine, (S)-(−)-1-(t-amyloxycarbonyl)-2-pyrrolidine methanol, (R)-(+)-1-(t-amyloxycarbonyl)-2-pyrrolidine methanol, N-t-amyloxycarbonyl-4-hydroxypiperidine, N-t-amyloxycarbonylpyrrolidine, N,N'-di-t- amyloxycarbonylpiperazine, N,N-di-t-amyloxycarbonyl-1-adamantylamine, N,N'-di-t-amyloxycarbonyl-N-methyl-1-adamantylamine, N-t-amyloxycarbonyl-4,4'-diaminodiphenylmethane, N,N-di-t-amyloxycarbonylhexamethylenediamine, N,N,N'N'-tetra-t-amyloxycarbonylhexamethylenediamine, N,N'-di-t-amyloxycarbonyl-1,7-diaminoheptane, N,N'-di-t-amyloxycarbonyl-1,8-diaminonooctane, N,N'-di-t-amyloxycarbonyl-1,9-diaminononane, N,N'-di-t-amyloxycarbonyl-1,10-diaminodecane, N,N'-di-t-amyloxycarbonyl-1,12-diaminododecane, N,N'-di-t-amyloxycarbonyl-4,4'-diaminodiphenylmethane, N-t-amyloxycarbonylbenzimidazole, N-t-amyloxycarbonyl-2-methylbenzimidazole, N-t-amyloxycarbonyl-2-phenylbenzimidazole, and the like.

Among these compounds, N-t-butoxycarbonyl dicyclohexylamine, N-t-butoxycarbonyl-1-adamantylamine, N-t-butoxycarbonyl-2-adamantylamine, (S)-(–)-1-(t-butoxycarbonyl)-2-pyrrolidinemethanol, (R)-(+)-1-(t-butoxycarbonyl)-2-pyrrolidinemethanol, N-t-butoxycarbonylpyrrolidine, N-t-butoxycarbonyl-4-hydroxypiperidine, N-t-butoxycarbonyl-2-phenylbenzimidazole, N-t-amyloxycarbonyl dicyclohexylamine, N-t-amyloxycarbonyl-1-adamantylamine, N-t-amyloxycarbonyl-2-adamantylamine, (S)-(–)-1-(t-amyloxycarbonyl)-2-pyrrolidinemethanol, (R)-(+)-1-(t-amyloxycarbonyl)-2-pyrrolidinemethanol, N-t-amyloxycarbonylpyrrolidine, N-t-amyloxycarbonyl-4-hydroxypiperidine, and N-t-amyloxycarbonyl-2-phenylbenzimidazole are preferable, and N-t-butoxycarbonyldicyclohexylamine, (R)-(+)-1-(t-butoxycarbonyl)-2-pyrrolidinemethanol, N-t-butoxycarbonylpyrrolidine, N-t-butoxycarbonyl-4-hydroxypiperidine, and N-t-butoxycarbonyl-2-phenylbenzimidazole are more preferable.

As examples of the acid diffusion controller (C) other than the nitrogen-containing compound (C-1), a tertiary amine compound, a quaternary ammonium hydroxide compound, a photodisintegrating base compound, a nitrogen-containing heterocyclic compound, and the like can be given.

Examples of the tertiary amine compound include tri(cyclo)alkylamines such as triethylamine, tri-n-propylamine, tri-n-butylamine, tri-n-pentylamine, tri-n-hexylamine, tri-n-heptylamine, tri-n-octylamine, cyclohexyl dimethylamine, dicyclohexyl methylamine, and tricyclohexylamine; aromatic amines such as aniline, N-methylaniline, N,N-dimethylaniline, 2-methylaniline, 3-methylaniline, 4-methylaniline, 4-nitroaniline, 2,6-dimethylaniline, and 2,6-diisopropylaniline; alkanolamines such as triethanolamine and N,N-di(hydroxyethyl)aniline; N,N,N',N'-tetramethylethylenediamine, N,N,N',N'-tetrakis(2-hydroxypropyl)ethylenediamine, 1,3-bis[1-(4-aminophenyl)-1-methylethyl]benzene tetramethylenediamine, bis(2-dimethylaminoethyl) ether, bis(2-diethylaminoethyl)ether, and the like.

As examples of the quaternary ammonium hydroxide compound, tetra-n-propylammonium hydroxide, tetra-n-butylammonium hydroxide, and the like can be given.

The photodecomposing base is an onium salt compound which lose basicity as an acid diffusion controller by decomposing upon exposure. As specific examples of such an onium salt compound, a sulfonium salt compound shown by the following formula (13-1) and an iodonium salt compound shown by the following formula (13-2) can be given,

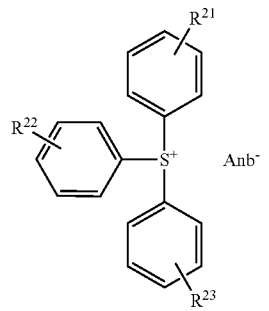

(13-1)

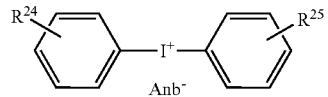

(13-2)

wherein $R^{21}$ to $R^{25}$ represent a hydrogen atom, an alkyl group, an alkoxyl group, a hydroxyl group, or a halogen atom, Anb⁻ represents OH⁻, $R^{26}COO^-$, $R^{26}SO_3^-$ (wherein $R^{26}$ represents an alkyl group, an aryl group, or an alkanol group), or an anion shown by the following formula (14).

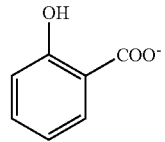

(14)

As specific examples of the sulfonium salt compound and iodonium salt compound, triphenylsulfonium hydrooxide, triphenylsulfonium acetate, triphenylsulfonium salicylate, diphenyl-4-hydroxyphenylsulfonium hydroxide, diphenyl-4-hydroxyphenylsulfonium acetate, diphenyl-4-hydroxyphenylsulfonium salicylate, bis(4-t-butylphenyl)iodonium hydroxide, bis(4-t-butylphenyl)iodonium acetate, bis(4-t-butylphenyl)iodonium hydroxide, bis(4-t-butylphenyl)iodonium acetate, bis(4-t-butylphenyl)iodonium salicylate, 4-t-butylphenyl-4-hydroxyphenyliodonium hydroxide, 4-t-butylphenyl-4-hydroxyphenyliodonium acetate, 4-t-butylphenyl-4-hydroxyphenyliodonium salicylate, bis(4-t-butylphenyl)iodonium 10-camphorsulfonate, diphenyliodonium 10-camphorsulfonate, triphenylsulfonium 10-camphorsulfonate, and 4-t-butoxyphenyl diphenylsulfonium 10-camphorsulfonate can be given.

Examples of the nitrogen-containing heterocyclic compound include pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinamide, quinoline, 4-hydroxyquinoline, 8-oxyquinoline, and acridine; piperazines such as piperazine, 1-(2-hydroxyethyl)piperazine; pyrazine, pyrazole, pyridazine, quinoxaline, purine, pyrrolidine, piperidine, 3-piperidino-1,2-propanediol, morpholine, 4-methylmorpholine, 1,4-dimethylpiperazine, 1,4-diazabicyclo[2.2.2]octane, imidazole, 4-methylimidazole, 1-benzyl-2-methylimidazole, 4-methyl-2-phenylimidazole, benzimidazole, 2-phenylbenzimidazole, N-t-butoxycarbonylbenzimidazole, N-t-butoxycarbonyl-2-methylbenzimidazole, N-t-butoxycarbonyl-2-phenylbenzimidazole, and the like.

The acid diffusion controllers (C) may be used either individually or in a combination of two or more.

The total amount of the acid diffusion controller (C) used in the resin composition of the embodiment of the present invention is preferably about 10 parts by mass or less, and more preferably about 5 parts by mass for 100 parts by mass of the polymer (A) from the viewpoint of ensuring high sensitivity as a resist. If this total amount is more than about 10 parts by mass, the sensitivity as a resist may be unduly impaired. If the amount of the acid diffusion controller (C) is less than about 0.001 part by mass, the pattern shape and dimensional accuracy as a resist may decrease depending on the process conditions.

[4] Solvent (D)

Any solvent capable of dissolving the polymer (A), the acid generator (B), the acid diffusion controller (C), and optionally added additives (E) may be used as the solvent (D) without any specific limitation.

As the solvent (D), propylene glycol monoalkyl ether acetates such as propylene glycol monomethyl ether acetate, propylene glycol monoethyl ether acetate, propylene glycol mono-n-propyl ether acetate, propylene glycol mono-i-propyl ether acetate, propylene glycol mono-n-butyl ether acetate, propylene glycol mono-i-butyl ether acetate, propylene glycol mono-sec-butyl ether acetate, and propylene glycol mono-t-butyl ether acetate; cyclic ketones such as cyclopentanone, 3-methylcyclopentanone, cyclohexanone, 2-methylcyclohexanone, 2,6-dimethylcyclohexanone, and isophorone; ketones such as 2-butanone, 2-pentanone, 3-methyl-2-butanone, 2-hexanone, 4-methyl-2-pentanone, 3-methyl-2-pentanone, 3,3-dimethyl-2-butanone, 2-heptanone, and 2-octanone; alkyl 2-hydroxypropionates such as methyl 2-hydroxypropionate, ethyl 2-hydroxypropionate, n-propyl 2-hydroxypropionate, i-propyl 2-hydroxypropionate, n-butyl 2-hydroxypropionate, i-butyl 2-hydroxypropionate, sec-butyl 2-hydroxypropionate, and t-butyl 2-hydroxypropionate; alkyl 3-alkoxypropionates such as methyl 3-methoxypropionate, ethyl 3-methoxypropionate, methyl 3-ethoxypropionate, and ethyl 3-ethoxypropionate; n-propyl alcohol, i-propyl alcohol, n-butyl alcohol, t-butyl alcohol, cyclohexanol, ethylene glycol monomethyl ether, ethylene glycol monoethyl ether, ethylene glycol mono-n-propyl ether, ethylene glycol mono-n-butyl ether, diethylene glycol dimethyl ether, diethylene glycol diethyl ether, diethylene glycol di-n-propyl ether, diethylene glycol di-n-propyl ether, diethylene glycol di-n-butyl ether, ethylene glycol monomethyl ether acetate, ethylene glycol monoethyl ether acetate, ethylene glycol mono-n-propyl ether acetate, propylene glycol monomethyl ether, propylene glycol monoethyl ether, propylene glycol mono-n-propyl ether, toluene, xylene, ethyl 2-hydroxy-2-methylpropionate, ethyl ethoxyacetate, ethyl hydroxyacetate, methyl 2-hydroxy-3-methylbutyrate, 3-methoxybutyl acetate, 3-methyl-3-methoxybutyl acetate, 3-methyl-3-methoxybutyl propionate, 3-methyl-3-methoxybutyl butyrate, ethyl acetate, n-propyl acetate, n-butyl acetate, methyl acetoacetate, ethyl acetoacetate, methyl pyruvate, ethyl pyruvate, N-methylpyrrolidone, N,N-dimethylformamide, N,N-dimethylacetamide, benzyl ethyl ether, di-n-hexyl ether, diethylene glycol monomethyl ether, diethylene glycol monoethyl ether, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, and propylene carbonate can be given.

Of these, propylene glycol monoalkyl ether acetates, particularly propylene glycol monomethyl ether acetate and propylene glycol monoethyl ether acetate are preferable. Other preferable solvents include ketones, alkyl 2-hydroxypropionates, alkyl 3-alkoxypropionates, γ-butyrolactone, and the like. These solvents may be used either individually or in a combination of two or more.

[5] Additives

Other additives such as a fluorine-containing resin, an alicyclic skeleton-containing resin, a surfactant, and a sensitizer can be optionally added to the radiation-sensitive resin composition of the embodiment of the present invention. The amount of each additive may be appropriately determined according to the purpose.

A fluorine-containing resin has an effect of exhibiting water repellency on the resist film surface particularly in a liquid immersion lithographic method. In addition, a fluorine-containing resin suppresses elusion of components from a resist film to an immersion solution and enables high speed scanning in liquid immersion lithography, consequently exhibiting an effect of suppressing defects due to an immersion liquid such as a water mark defect.

There are no particular limitations the structure of the fluorine-containing resin. As examples, (1) a fluorine-containing resin which is insoluble in a developer itself, but becomes soluble in alkali by the action of an acid, (2) a fluorine-containing resin which is soluble in a developer, and increases its alkali solubility by the action of an acid, (3) a fluorine-containing resin which is insoluble in a developer itself, but becomes soluble in an alkali by the action of an alkali, (4) a fluorine-containing resin which is soluble in a developer itself, and increases its alkali solubility by the action of an alkali, and the like can be given.

As the fluorine-containing resin, a resin including a polymer which has at least one repeating unit selected from the repeating unit (a-7) and a fluorine-containing repeating unit is preferable, and a resin including a polymer which further has at least one repeating unit selected from the group consisting of the repeating units (a-1) to (a-4), (a-6), a-8), and (a-9) is more preferable.

As preferable examples of the fluorine-containing repeating unit, trifluoromethyl(meth)acrylate, 2,2,2-trifluoroethyl(meth)acrylate, perfluoro-ethyl(meth)acrylate, perfluoro-n-propyl(meth)acrylate, perfluoro-i-propyl(meth)acrylate, perfluoro-n-butyl (meth)acrylate, perfluoro-i-butyl(meth)acrylate, perfluoro-t-butyl(meth)acrylate, perfluorocyclohexyl(meth)acrylate, 2-(1,1,1,3,3,3-hexafluoro)propyl(meth)acrylate, 1-(2,2,3,3,4,4,5,5-octafluoro)pentyl(meth)acrylate, 1-(2, 2,3,3,4,4,5,5-octafluoro)hexyl(meth)acrylate, Perfluorocyclohexylmethyl(meth)acrylate, 1-(2, 2,3,3,3-pentafluoro)propyl(meth)acrylate, 1-(2,2,3,3,4,4,4-heptafluoro)penta(meth)acrylate, 1-(3,3,4,4,5,5,6,6,7,7,8,8, 9,9, 10,10,10-heptadecafluoro)decyl(meth)acrylate, 1-(5-trifluoromethyl-3,3,4,4,5,6,6,6-octafluoro)hexyl(meth)acrylate, and the like can be given.

As specific examples of the fluorine-containing resin, a polymer consisting of a combination of the following repeating unit (E-1a) to (E-1f), and the like is preferable. These fluorine-containing resins may be used either individually or in a combination of two or more.

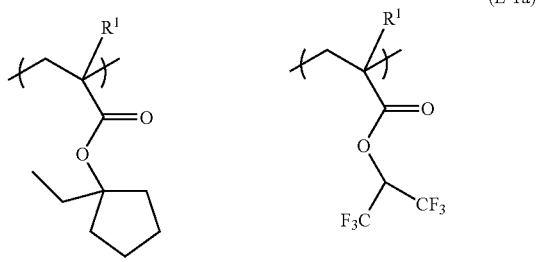

(E-1a)

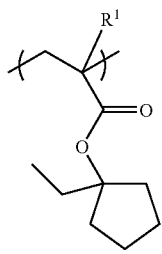
(E-1b)

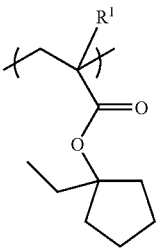
(E-1c)

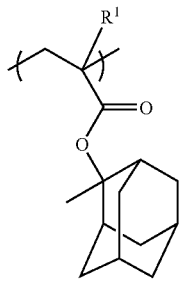
(E-1d)

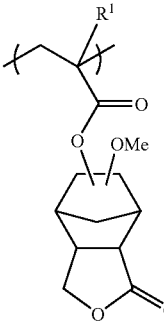

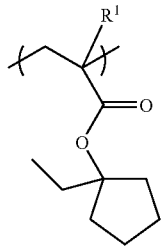

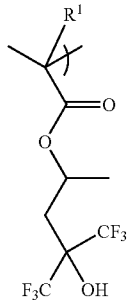

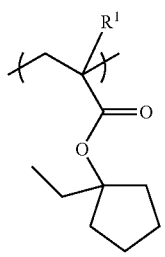
(E-1e)

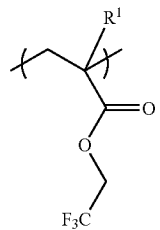
(E-1f)

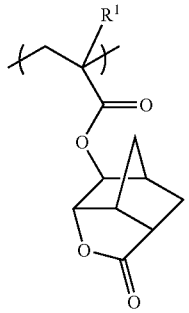

An alicyclic skeleton-containing resin is a component which further improves the dry etching resistance, pattern shape, adhesion to substrate, and the like.

As examples of the alicyclic skeleton-containing resin, adamantane derivatives such as 1-adamantane carboxylate, 2-adamantanon, t-butyl-1-adamantane carboxylate, t-butoxycarbonylmethyl-1-adamantane carboxylate, α-butyrolactone-1-adamantane carboxylate, di-t-butyl-1,3-adamantanedicarboxylate, t-butyl-1-adamantane acetate, t-butoxycarbonylmethyl-1-adamantane acetate, di-t-butyl-1,3-adamantane diacetate, and 2,5-dimethyl-2,5-di(adamantylcarbonyloxy)hexane; deoxycholates such as t-butyl deoxycholate, t-butoxycarbonylmethyl deoxycholate, 2-ethoxyethyl deoxycholate, 2-cyclohexyloxyethyl deoxycholate, 3-oxocyclohexyl deoxycholate, tetrahydropyranyl deoxycholate, and mevalonolactone deoxycholate; lithocholates such as t-butyl lithocholate, t-butoxycarbonylmethyl lithocholate, 2-ethoxyethyl lithocholate, 2-cyclohexyloxyethyl lithocholate, 3-oxocyclohexyl lithocholate, tetrahydropyranyl lithocholate, and mevalonolactone lithocholate; alkylcarboxylates such as dimethyl adipate, diethyl adipate, dipropyl adipate, di-n-butyl adipate, and di-t-butyl adipate; 3-[2-hydroxy-2,2-bis(trifluoromethyl)ethyl]tetracyclo [$4.4.0.1^{2,5}.1^{7,10}$]dodecane, 2-hydroxy-9-methoxycarbonyl-5-oxo-4-oxa-tricyclo[$4.2.1.0^{3,7}$]nonane, and the like can be given. These alicyclic skeleton-containing resins may be used either individually or in combinations of two or more.

The surfactant improves applicability, striation, developability, and the like of the radiation-sensitive resin composition. As the surfactants, nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, and polyethylene glycol distearate; commercially available products such as "KP341" (manufactured by Shin-Etsu Chemical Co., Ltd.), "Polyflow No. 75" and "Polyflow No. 95" (manufactured by Kyoeisha Chemical Co., Ltd.), "EFTOP EF301", "EFTOP EF303", and "EFTOP EF352" (manufactured by JEMCO, Inc.), "MEGAFAC F171" and "MEGAFAC F173" (manufactured by DIC Corporation), "Fluorad FC430" and "Fluorad FC431" (manufactured by Sumitomo 3M Ltd.), "Asahi Guard AG710", "Surflon S-382", "Surflon SC-101", "Surflon SC-102", "Surflon SC-103", "Surflon SC-104", "Surflon SC-105", and "Surflon SC-106" (manufactured by Asahi Glass Co., Ltd.), and the like can be given. These surfactants may be used either individually or in a combination of two or more.

The sensitizers absorb radiation energy and transmit the energy to the acid generator (B), thereby increasing the amount of acid generated upon exposure. The sensitizers improve apparent sensitivity of the radiation-sensitive resin composition.

As examples of the sensitizer, carbazoles, acetophenones, benzophenones, naphthalenes, phenols, biacetyl, eosin, Rose Bengal, pyrenes, anthracenes, phenothiazines, and the like can be given. These sensitizers may be used either individually or in a combination of two or more.

As the additive (E), a dye, a pigment, an adhesion adjuvant, and the like can be used. Addition of a dye or a pigment visualizes a latent image in the exposed area, thereby decreasing the effect of halation during exposure. Use of an adhesion adjuvant improves adhesion to a substrate. As other additives, a low molecular weight alkali solubility controller containing an alkali-soluble resin and an acid dissociable protecting group, a halation inhibitor, a preservation stabilizer, an antifoaming agent, and the like can be given.

The additive (E) may be used either individually or in a combination of two or more.

[6] Formation of Photoresist Pattern

The radiation-sensitive resin composition of the embodiment of the present invention is useful as a chemically-amplified resist. In a chemically-amplified resist, an acid-dissociable group in the resin component, mainly in the polymer (A), is dissociated by the action of an acid generated by an acid generator upon exposure to form a carboxyl group. As a result, the solubility of the resist in the exposed area in an alkaline developer increases, and the exposed area is dissolved and removed by the alkaline developer to form a positive-tone photoresist pattern.

The method of forming a photoresist pattern of the embodiment of the present invention includes (1) a step of forming a photoresist film on a substrate using the above-mentioned radiation-sensitive resin composition (hereinafter referred to from time to time as "step (1)"), (2) a step of exposing the photoresist film to radiation through a mask having a predetermined pattern, optionally through an immersion medium (hereinafter referred to from time to time as "step (2)"), and (3) a step of developing the exposed photoresist film to forming a photoresist pattern (hereinafter referred to from time to time as "step (3)").

The pattern forming method of the embodiment of the present invention may further include a step of forming an immersion liquid protecting film insoluble in the immersion liquid on a resist film in order to prevent direct contact of the liquid used for liquid immersion lithography and the resist film. As the immersion liquid protecting film, either a solvent peeling-type protecting film which is peeled by a solvent prior to the step (3) (see Japanese Patent Application Publication (KOKAI) No. 2006-227632, for example) or a developer peeling-type protecting film which is peeled during development of the step (3) (see WO 2005-069076 and WO 2006-035790, for example) may be used. However, the developer peeling-type protecting film is preferred from the viewpoint of throughput.

In the step (1), a photoresist film is formed by applying a resin composition solution obtained by dissolving the radiation-sensitive resin composition of the embodiment of the present invention in a solvent to a substrate such as a silicon wafer or a wafer coated with silicon dioxide by an appropriate application method such as rotational coating, cast coating, and roll coating. Specifically, after applying the resist composition solution in an amount to obtain a resist film with a prescribed thickness, the resist film can be formed by prebaking (PB) the coating to volatilize the solvent in the coating.

Although not particularly limited, the thickness of the resist film is preferably about 0.1 to about 5 µm, and more preferably about 0.1 to about 2 µm.

The prebake temperature varies depending on the composition of the radiation-sensitive resin composition, but is preferably about 30 to about 200° C., and more preferably about 50 to about 150° C.

In order to bring out the potential of the radiation-sensitive resin composition of the embodiment of the present invention to the maximum extent in forming a photoresist pattern, it is preferable to form an organic or inorganic antireflection film on the substrate (see Japanese Examined Patent Application Publication (KOKOKU) No. 6-12452, for example). A protective film may be provided on the photoresist film in order to prevent an adverse effect of basic impurities and the like that are present in the environmental atmosphere (see Japanese Patent Application Publication (KOKAI) No. 5-188598, for example). Further, the above immersion liquid protecting film may be provided on the photoresist film. These techniques may be used in combination.

Next, in the step (2), a selected area of the photoresist film formed in the step (1) is exposed to radiation (occasionally via an immersion liquid medium such as water). In this instance, radiation is applied through a mask having a predetermined pattern.

The radiation used for exposure is appropriately selected from visible rays, ultraviolet rays, deep ultraviolet rays, X-rays, charged particle rays, and the like according to the type of the acid generator to be used. Deep ultraviolet rays such as an ArF excimer laser (wavelength: 193 nm) and a KrF excimer laser (wavelength: 248 nm) are preferable. Among these, an ArF excimer laser is more preferable.

The exposure conditions such as an exposure dose are appropriately determined depending on the composition of the radiation-sensitive resin composition, types of additives, and the like. In the embodiment of the present invention, it is preferable to perform post-exposure bake (PEB) after exposure. PEB ensures smooth dissociation of the acid-dissociable group in the polymer. The PEB temperature varies depending on the composition of the radiation-sensitive resin composition, but is preferably about 30 to about 200° C., and more preferably about 50 to about 170° C.

In the step (3), the photoresist film after exposure is developed using a developer to form a predetermined photoresist pattern. After development, the photoresist film is usually washed with water and dried.

As a developer, an alkaline aqueous solution prepared by dissolving at least one alkaline compound such as sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, ethyldimethylamine, triethanolamine, tetramethylammonium hydroxide, pyrrole, piperidine, choline, 1,8-diazabicyclo-[5.4.0]-7-undecene, and 1,5-diazabicyclo-[4.3.0]-5-nonene is preferable. The concentration of the alkaline aqueous solution is usually 10 mass % or less. If the concentration of the alkaline aqueous solution exceeds 10 mass %, an unexposed part may be dissolved in the developer.

In preparing the developer, an organic solvent may be added to the alkaline aqueous solution. As examples of the organic solvent, ketones such as acetone, methyl ethyl ketone, methyl i-butyl ketone, cyclopentanone, cyclohexanone, 3-methylcyclopentanone, and 2,6-dimethylcyclohexanone; alcohols such as methylalcohol, ethylalcohol, n-propylalcohol, i-propylalcohol, n-butylalcohol, t-butylalcohol, cyclopentanol, cyclohexanol, 1,4-hexanediol, and 1,4-hexanedimethylol; ethers such as tetrahydrofuran and dioxane; esters such as ethyl acetate, n-butyl acetate, and i-amyl acetate; aromatic hydrocarbons such as toluene and xylene; phenol, acetonylacetone, dimethylformamide; and the like can be given. These organic solvents may be used either individually or in a combination of two or more.

The amount of the organic solvent to be used is preferably about 100 vol % or less for 100 vol % of the alkaline aqueous solution. An amount of the organic solvent exceeding 100 parts by volume may decrease developability, giving rise to a larger undeveloped portion in the exposed area. An appropriate amount of a surfactant or the like may also be added to the developer.

EXAMPLES

The present invention is described below in detail based on examples. However, the present invention is not limited to the following examples. In the examples, "part" refers to "parts by mass" and "%" refers to "mass %" unless otherwise indicated. Each property value measuring method and each property evaluation method are given below. [Mw, Mn, and Mw/Mn]

Mw and Mn were measured by gel permeation chromatography (GPC) using monodisperse polystyrene as a standard and using GPC columns (manufactured by Tosoh Corp., G2000HXL×2, G3000HXL×1, G4000HXL×1) at a flow rate of 1.0 ml/minute, using tetrahydrofuran as an eluate, at a column temperature of 40° C. The distribution (Mw/Mn) was calculated from the Mw and Mn measurement results.

[$^{13}$C-NMR Analysis]

$^{13}$C-NMR analysis of each polymer was carried out using a nuclear magnetic resonance apparatus ("JNM-ECX400" manufactured by JEOL Ltd.).

(Synthesis of Polymer (A)

In each of the Synthesis Examples, the following monomers (M-1) to (M-10) were used to synthesize polymers (A-1) to (A-15). Monomers (M-7) to (M-8) are monomers corresponding to the repeating unit (a-1), monomers (M-1) to (M-6) are monomers corresponding to the repeating unit (a-2), monomer (M-9) is a monomer corresponding to the repeating unit (a-3), monomer (M-10) is a monomer corresponding to the repeating unit (a-4), and monomers (M-11) is a monomer corresponding to the repeating unit (a-6).

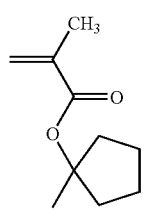
(M-1)

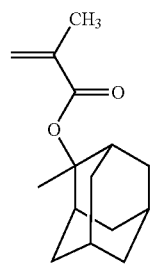
(M-2)

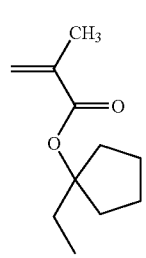
(M-3)

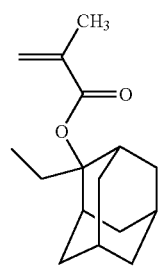
(M-4)

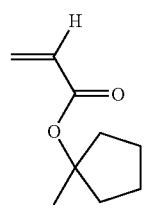
(M-5)

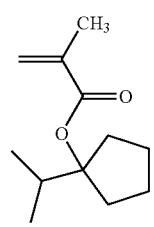
(M-6)

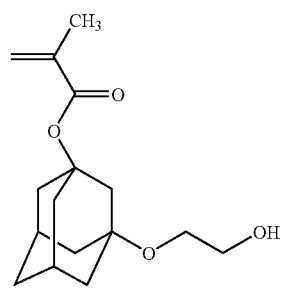
(M-7)

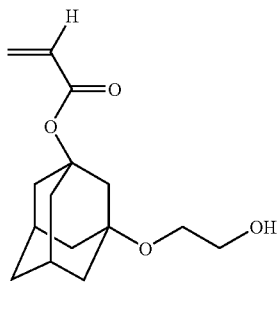

(M-8)

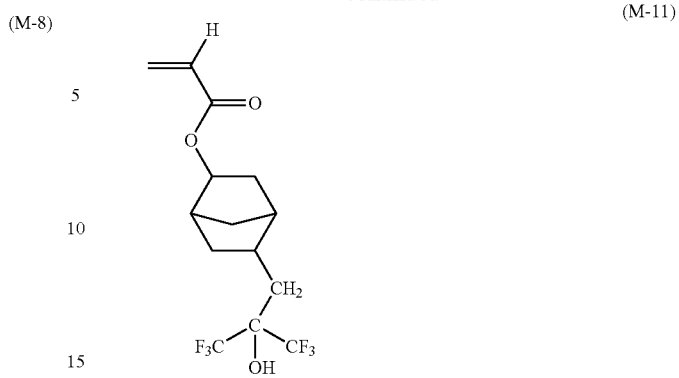

(M-11)

(M-9)

(M-10)

Synthesis Example 1

Polymer (A-1)

A monomer solution was prepared by dissolving 16.20 g (40 mol %) of monomer (M-1), 5.64 g (10 mol %) of monomer (M-2), 6.75 g (10 mol %) of monomer (M-7), and 21.40 g (40 mol %) of monomer (M-10) in 100 g of 2-butanone, and further adding 1.98 g of 2,2'-azobis(isobutylonitrile) as an initiator.

A 500 ml three-necked flask equipped with a thermometer and a dropping funnel was charged with 50 g of 2-butanone and purged with nitrogen for 30 minutes. After nitrogen purge, the contents of the flask were heated to 80° C. while stirring using a magnetic stirrer. The previously prepared monomer solution was added to the flask dropwise using the dropping funnel over 3 hours. The monomers were polymerized for six hours from the start of dropping the monomer solution. After polymerization, the polymer solution was cooled with water to 30° C. or less. After cooling, the reaction mixture was poured to 1000 g of methanol, and a deposited white powder was separated by filtration. The white powder separated by filtration was washed twice with 200 g of methanol in a slurry state. The powder was again filtered and the resulting collected white powder was dried at 50° C. for 17 hours to obtain a white powdery copolymer (34.5 g, yield: 69%). This copolymer is referred to as polymer (A-1).

The copolymer had an Mw of 5095 and an Mw/Mn ratio of 1.70. $^{13}$C-NMR analysis was carried out to calculate the monomer composition ratio of the polymer (A-1). As a result, peaks attributed to the monomers (M-1), (M-2), (M-7), and (M-10) appeared respectively at 89 ppm, 88 ppm, 61 ppm, and 178 ppm. The monomer composition ratio of the polymer (A-1) was calculated from the integration ratio of each peak and the corresponding carbon atoms. As a result, the content of each monomer unit derived from the monomers (M-1), (M-2), (M-7), and (M-10) was 36.4:8.1:9.9:45.6 (mol %). The results are shown in Table 1.

TABLE 1

| Monomer: upper column: charge amount (mol %), lower column: content in polymer determined by $^{13}$C-NMR (mol %) | | | | | | | | | | | | | | |
|---|---|---|---|---|---|---|---|---|---|---|---|---|---|---|
| Polymer | M-1 | M-2 | M-3 | M4 | M-5 | M-6 | M-7 | M-8 | M-9 | M-10 | M-11 | Mw | Mw/Mn | Yield (%) |
| A-1 | 40 | 10 | — | — | — | — | 10 | — | — | 40 | — | 5095 | 1.55 | 69 |
|  | 36.4 | 8.1 |  |  |  |  | 9.9 |  |  | 45.6 |  |  |  |  |
| A-2 | 30 | 20 | — | — | — | — | 10 | — | — | 40 | — | 4530 | 1.52 | 68 |
|  | 28.1 | 18.0 |  |  |  |  | 10.3 |  |  | 43.6 |  |  |  |  |
| A-3 | 50 | — | — | — | — | — | 10 | — | — | 40 | — | 5412 | 1.51 | 67 |
|  | 42.9 |  |  |  |  |  | 10.4 |  |  | 46.7 |  |  |  |  |

TABLE 1-continued

Monomer: upper column: charge amount (mol %), lower column: content in polymer determined by $^{13}$C-NMR (mol %)

| Polymer | M-1 | M-2 | M-3 | M4 | M-5 | M-6 | M-7 | M-8 | M-9 | M-10 | M-11 | Mw | Mw/Mn | Yield (%) |
|---|---|---|---|---|---|---|---|---|---|---|---|---|---|---|
| A-4 | 40 | — | — | — | — | — | 10 | — | — | 50 | — | 4596 | 1.85 | 74 |
|  | 35.8 |  |  |  |  |  | 9.5 |  |  | 54.7 |  |  |  |  |
| A-5 | 30 | — | — | — | — | — | 20 | — | — | 50 | — | 4309 | 1.53 | 72 |
|  | 25.4 |  |  |  |  |  | 20.7 |  |  | 53.9 |  |  |  |  |
| A-6 | 35 | 15 | — | — | — | — | 5 | — | — | 45 | — | 4392 | 1.56 | 72 |
|  | 31.2 | 13.9 |  |  |  |  | 4.8 |  |  | 50.1 |  |  |  |  |
| A-7 | 30 | — | — | 10 | — | — | — | 10 | — | 50 | — | 5060 | 1.40 | 60 |
|  | 26.9 |  |  | 7.8 |  |  |  | 11.9 |  | 53.4 |  |  |  |  |
| A-8 | — | 15 | 35 | — | — | — | 10 | — | — | 40 | — | 4078 | 1.36 | 73 |
|  |  | 14.3 | 32.5 |  |  |  | 9.8 |  |  | 43.4 |  |  |  |  |
| A-9 | — | — | 50 | — | — | — | 10 | — | 10 | 30 | — | 3935 | 1.46 | 85 |
|  |  |  | 44.5 |  |  |  | 9.7 |  | 12.2 | 33.6 |  |  |  |  |
| A-10 | 25 | — | — | — | 15 | — | 10 | — | 20 | 30 | — | 4111 | 1.76 | 72 |
|  | 20.2 |  |  |  | 13.2 |  | 9.7 |  | 23.2 | 33.7 |  |  |  |  |
| A-11 | — | — | — | — | — | 30 | 10 | — | — | 60 | — | 4626 | 1.53 | 70 |
|  |  |  |  |  |  | 24.8 | 9.5 |  |  | 65.7 |  |  |  |  |
| A-12 | 50 | — | — | — | — | — | 50 | — | — | — | — | 7365 | 1.83 | 75 |
|  | 45.4 |  |  |  |  |  | 54.6 |  |  |  |  |  |  |  |
| A-13 | 35 | 15 | — | — | — | — | — | — | — | 50 | — | 7139 | 1.50 | 78 |
|  | 30.6 | 12.1 |  |  |  |  |  |  |  | 57.3 |  |  |  |  |
| A-14 | 50 | — | — | — | — | — | — | — | — | 50 | — | 4311 | 1.34 | 74 |
|  | 43.1 |  |  |  |  |  |  |  |  | 56.9 |  |  |  |  |
| A-15 | — | — | 50 | — | — | — | — | — | 10 | 40 | — | 4117 | 1.54 | 85 |
|  |  |  | 42.8 |  |  |  |  |  | 11.6 | 45.6 |  |  |  |  |
| A-16 | — | — | — | — | — | — | — | 20 | — | — | 80 | 5700 | 1.59 | 83 |
|  |  |  |  |  |  |  |  | 20 |  |  | 80 |  |  |  |

Synthesis Examples 2 to 15

Polymers (A-2) to (A-15)

Polymers (A-2) to (A-15) were prepared in the same manner as in Synthesis Example 1, except for using monomers shown in Table 1 in amounts shown in Table 1.

Synthesis Example 16

Synthesis of Polymer (A-16)

12.68 g of (M-11), 2.48 g of (M-8), and 0.32 g of dimethyl azobisisobutyrate (initiator) were dissolved in 80 ml of THF (tetrahydrofuran). After the nitrogen bubbling for about 10 minutes, the mixture was stirred for 4 hours while heating using an oil bath at 70° C., and cooled to room temperature. After concentrating the reaction mixture using an evaporator, the concentrate was dissolved in 75 ml of THF, and poured into 2000 ml of heptane to deposit a polymer. The polymer was collected by filtration and dried in a dryer at 40° C. for 24 hours to obtain 12.9 g of a white solid. The weight average molecular weight (Mw) of the resulting polymer was 5700, the molecular weight distribution (Mw/Mn) was 1.5, the molar ratio of the repeating units derived from monomer (M-8) and monomer (M-11) was 20:80.

The ratio of the repeating units (mol %) determined by $^{13}$C-NMR analysis, yield (%), Mw, and Mw/Mn (molecular weight dispersion) of the polymers (A-2) to (A-16) are shown in Table 1.

Synthesis Example 17

Polymer (A-17)

A monomer solution was prepared by dissolving 11.79 g (30 mol %) monomer (M-1), 10.97 g (20 mol %) of monomer (M-2), 6.54g (10 mol %) of monomer (M-7), and 20.74 g (40 mol %) of monomer (M-10) in 100 g of 2-butanone, and further adding 1.92 g of 2,2'-azobis(isobutylonitrile) as an initiator.

A 500 ml three-necked flask equipped with a thermometer and a dropping funnel was charged with 50 g of 2-butanone and purged with nitrogen for 30 minutes. After nitrogen purge, the contents of the flask were heated to 80° C. while stirring using a magnetic stirrer. The previously prepared monomer solution was added to the flask dropwise using the dropping funnel over 4 hours. The monomers were polymerized for seven hours from the start of dropping the monomer solution. After polymerization, the polymer solution was cooled with water to 30° C. or less. After cooling, the reaction mixture was poured to 2000 g of methanol, and a deposited white powder was separated by filtration. The white powder separated by filtration was washed twice with 200 g of methanol in a slurry state. The powder was again filtered and the resulting collected white powder was dried at 50° C. for 17 hours to obtain a white powdery copolymer (37.5 g, yield: 75%). This copolymer is referred to as polymer (A-17).

The copolymer had an Mw of 8390 and an Mw/Mn ratio of 1.48. $^{13}$C-NMR analysis was carried out to calculate the monomer composition ratio of the polymer (A). As a result, peaks attributed to the monomers (M-1), (M-2), (M-7), and (M-10) appeared respectively at 89 ppm, 88 ppm, 61 ppm, and 178 ppm. The monomer composition ratio in the polymer (A-17) was calculated from the integration ratio of each peak and the corresponding carbon atoms. As a result, the content of each monomer unit derived from the monomers (M-1), (M-2), (M-7), and (M-10) was 29.6:19.1:9.7:41.6 (mol %). The measurement results are shown in Table 2.

TABLE 2

Monomer: upper column: charge amount (mol %), lower column: content in polymer determined by $^{13}$C-NMR (mol %)

| Polymer | M-1 | M-2 | M-3 | M4 | M-5 | M-6 | M-7 | M-8 | M-9 | M-10 | M-11 | Mw | Mw/Mn | Yield (%) |
|---|---|---|---|---|---|---|---|---|---|---|---|---|---|---|
| A-17 | 30 | 20 | — | — | — | — | 10 | — | — | 40 | — | 8390 | 1.48 | 75 |
|  | 29.6 | 19.1 |  |  |  |  | 9.7 |  |  | 41.8 |  |  |  |  |
| A-18 | 40 | — | — | — | — | — | 10 | — | — | 50 | — | 10730 | 1.45 | 74 |
|  | 36.7 |  |  |  |  |  | 9.5 |  |  | 53.8 |  |  |  |  |
| A-19 | — | 35 | 15 | — | — | — | 10 | — | — | 40 | — | 5170 | 1.60 | 72 |
|  |  | 33.2 | 14.4 |  |  |  | 10.2 |  |  | 42.2 |  |  |  |  |
| A-20 | — | 35 | 15 | — | — | — | — | — | 20 | 30 | — | 5500 | 1.45 | 72 |
|  |  | 33.8 | 14.4 |  |  |  |  |  | 20.1 | 31.7 |  |  |  |  |

Synthesis Examples 18 to 20

Polymers (A-18) to (A-20)

Polymers (A-18) to (A-20) were prepared in the same manner as in Synthesis Example 17, except for using monomers shown in Table 2 in amounts shown in Table 2.

Preparation of Radiation-Sensitive Resin Compositions

The composition of the radiation-sensitive resin compositions prepared in the Examples and Comparative Examples are shown in Tables 3 and 4. The components forming the radiation-sensitive resin compositions other than the polymers (A-1) to (A-20) synthesized in the above Synthesis Examples, that is, the acid generators (B), acid diffusion controllers (C), solvents (D), and additives (E), are shown below.

<Acid Generator (B)>
(B-1): Triphenylsulfonium nonafluoro-n-butanesulfonate
(B-2): 1-(4-n-butoxynaphthalen-1-yl)tetrahydrothiophenium nonafluoro-n-butanesulfonate
(B-3): triphenylsulfonium 2-(bicyclo[2.2.1]hept-2-yl)-1,1-difluoroethanesulfonate
(B-4): 1-(4-n-butoxynaphthalen-1-yl)tetrahydrothiophenium 2-(bicyclo[2.2.1]heptan-2-yl)-1,1,2,2-tetrafluoroethanesulfonate
(B-5): triphenylsulfonium trifluoromethanesulfonate <Acid Diffusion Controller (C)>
(C-1): N-t-butoxycarbonyl-4-hydroxypiperidine
(C-2): (R)-(+)-1-(t-butoxycarbonyl)-2-piperidinemethanol
(C-3): N-t-butoxycarbonylpyrrolidine
(C-4): tri-isopropanolamine <Solvent (D)>
(D-1): propylene glycol monomethyl ether acetate
(D-2): cyclohexanone
(D-3): γ-butyrolactone
(D-4): propylene glycol monomethyl ether acetate <Additive (E)>
(E-1): tetramethoxy methylated glycoluril

TABLE 3

| | Polymer (part) | Acid generator (part) | Acid diffusion controller (part) | Solvent (part) | Additive (part) |
|---|---|---|---|---|---|
| Example 1 | A-1 (100) | B-1 (8.4) | C-1 (0.9) | D-1 (910), D-2 (390), D-3 (30) | — |
| Example 2 | A-2 (100) | B-2 (8.8) | C-1 (0.6) | D-1 (910), D-2 (390), D-3 (30) | — |
| Example 3 | A-3 (100) | B-1 (7.0) | C-1 (0.6) | D-1 (910), D-2 (390), D-3 (30) | — |
| Example 4 | A-4 (100) | B-3 (8.4) | C-2 (0.9) | D-1 (910), D-2 (390), D-3 (30) | — |
| Example 5 | A-5 (100) | B-1 (8.4) | C-3 (0.45) | D-1 (910), D-2 (390), D-3 (30) | — |
| Example 6 | A-6 (100) | B-2 (8.4) | C-3 (0.8) | D-1 (910), D-2 (390), D-3 (30) | — |
| Example 7 | A-7 (100) | B-4 (7.5) | C-1 (0.5) | D-1 (910), D-2 (390), D-3 (30) | — |
| Example 8 | A-8 (100) | B-1 (4.2), B-3 (3.8) | C-1 (0.9) | D-1 (910), D-2 (390), D-3 (30) | — |
| Example 9 | A-9 (100) | B-1 (4.2), B-2 (4.4) | C-1 (0.6) | D-1 (910), D-2 (390), D-3 (30) | — |
| Example 10 | A-10 (100) | B-2 (8.8) | C-1 (0.3), C-2 (0.3) | D-1 (910), D-2 (390), D-3 (30) | — |
| Example 11 | A-11 (100) | B-2 (12) | C-3 (1.5) | D-1 (910), D-2 (390), D-3 (30) | — |

TABLE 3-continued

|  | Polymer (part) | Acid generator (part) | Acid diffusion controller (part) | Solvent (part) | Additive (part) |
|---|---|---|---|---|---|
| Example 12 | A-12 (100) | B-1 (8.4) | C-1 (0.9) | D-1 (910), D-2 (390), D-3 (30) | — |
| Comparative Example 1 | A-13 (100) | B-2 (8.4) | C-3 (0.8) | D-1 (910), D-2 (390), D-3 (30) | — |
| Comparative Example 2 | A-14 (100) | B-1 (8.4) | C-1 (0.9) | D-1 (910), D-2 (390), D-3 (30) | — |
| Comparative Example 3 | A-15 (100) | B-3 (8.4) | C-3 (0.9) | D-1 (910), D-2 (390), D-3 (30) | — |
| Comparative Example 4 | A-16 (100) | B-5 (1.5) | C-4 (0.3) | D-4 (1150) | E-1 (5.0) |

TABLE 4

|  | Polymer (part) | Acid generator (part) | Acid diffusion controller (part) | Solvent (part) | Additive (part) |
|---|---|---|---|---|---|
| Example 13 | A-17 (100) | B-1 (8.0) | C-1 (0.9) | D-1 (910), D-2 (390), D-3 (30) | — |
| Example 14 | A-17 (100) | B-2 (8.4) | C-2 (0.6) | D-1 (910), D-2 (390), D-3 (30) | — |
| Example 15 | A-17 (100) | B-3 (8.4) | C-3 (0.9) | D-1 (910), D-2 (390), D-3 (30) | — |
| Example 16 | A-17 (100) | B-3 (6.3) | C-2 (0.5) | D-1 (910), D-2 (390), D-3 (30) | — |
| Example 17 | A-18 (100) | B-1 (8.0) | C-4 (0.9) | D-1 (910), D-2 (390), D-3 (30) | — |
| Example 18 | A-18 (100) | B-2 (8.4) | C-1 (0.9) | D-1 (910), D-2 (390), D-3 (30) | — |
| Example 19 | A-18 (100) | B-3 (8.4) | C-3 (0.9) | D-1 (910), D-2 (390), D-3 (30) | — |
| Example 20 | A-19 (100) | B-3 (8.4) | C-4 (0.9) | D-1 (910), D-2 (390), D-3 (30) | — |
| Example 21 | A-19 (100) | B-1 (8.4) | C-2 (09) | D-1 (910), D-2 (390), D-3 (30) | — |
| Example 22 | A-17 (50), A-20 (50) | B-2 (8.4) | C-3 (0.9) | D-1 (910), D-2 (390), D-3 (30) | — |
| Example 23 | A-19 (70), A-20 (30) | B-1 (8.0) | C-1 (0.9) | D-1 (910), D-2 (390), D-3 (30) | — |
| Example 24 | A-17 (50), A-19 (50) | B-2 (7.0) | C-2 (0.4) | D-1 (910), D-2 (390), D-3 (30) | — |
| Comparative Example 5 | A-20 (100) | B-1 (8.0) | C-1 (0.9) | D-1 (910), D-2 (390), D-3 (30) | — |

Example 13

100 parts by mass of the polymer (A-17) obtained in Synthesis-Example 17 was dissolved in 400 parts by mass of propylene glycol monomethyl ether acetate (D-1) which is used as a solvent (D). The solution was filtered through a hydrophilic nylon 6,6 filter with a pore diameter of 0.04 μm ("Photoclean DDF" manufactured by Pall Corporation) to prepare a resin solution. 8.0 parts by mass of triphenylsulfonium nonafluoro-n-butane sulfonate (B-1) as an acid generator (B) and 0.9 parts by mass of N-t-butoxycarbonyl-4-hydroxypiperidine (C-1) as an acid diffusion controller (C) were added to the resin solution. Then, 510 parts by mass of propylene glycol monomethyl ether acetate (D-1), 390 parts by mass of cyclohexanone (D-2), and 30 parts by mass of γ-butyrolactone (D-3) as solvent (D) were added and mixed. The resulting mixture was filtered by circulating through a hydrophilic nylon 6,6 filter with a pore diameter of 0.02 μm ("Photoclean DDF Ultipleat P-Nylon" manufactured by Pall Corporation) to prepare a radiation-sensitive resin composition. The composition of the radiation-sensitive resin composition is shown in Table 4.

Examples 14 to 24 and Comparative Example 5

Radiation-sensitive resin compositions of Examples 14 to 24 and Comparative Example 5 were obtained in the same manner as in Example 13, except for changing the components as shown in Table 4.

[Evaluation Method]

The peel margin, sensitivity, high-density line depth of focus, and isolated line depth of focus of the radiation-sensitive resin compositions obtained in Examples 1 to 24 and Comparative Examples 1 to 5 were evaluated using an ArF excimer laser as a light source. The evaluation results are shown in Tables 5 and 6.

(1) Peel Margin (%)

An 8 inch, 100 nm $SiO_2$ substrate was dehydrated by leaving it in an HMDS (hexamethyldisilazane) atmosphere at 150° C. for 10 seconds. The radiation-sensitive resin compositions of the Examples and Comparative Examples were applied to the surface of the substrate by spin coating and pre-baked (PB) for 60 seconds on a hot plate at a temperature shown in Table 5 to form a resist film with a thickness of 250 nm.

The resist films were exposed to radiation through a mask pattern using a full field reduced projection exposure apparatus ("S306C" manufactured by Nikon Corp., NA 0.78). After post exposure baking (PEB) for 60 seconds at a temperature shown in Table 5, the resist films were developed using a 2.38 mass % tetramethylammonium hydroxide aqueous solution (hereafter referred to as "TMAH aqueous solution") at 25° C. for 60 seconds, washed with water, and dried to form positive-tone resist patterns.

A dose ($mJ/cm^2$) when a 1:1 line-and-space pattern having a line width of 220 nm was formed through a 1:1 line-and-space mask having a line width of 220 nm was determined to be an optimum dose ($mJ/cm^2$), which is indicated as "Ecd". A dose ($mJ/cm^2$) at which a 1 μm square pattern was peeled, is referred to as "Epeel". A value Epeel/Ecd×100 was calculated and regarded as a peel margin (%). When the peel margin was 100% or more, the product was evaluated as "Good"; and when it was less than 100%, the product was evaluated as "Bad". A scanning electron microscope ("S-220" manufactured by Hitachi High-Technologies Corporation) was used for measurement and evaluation of the pattern dimension and "Epeel".

(2) Sensitivity ($mJ/cm^2$)

An 8 inch, 100 nm $SiO_2$ substrate was dehydrated by leaving it in an HMDS (hexamethyldisilazane) atmosphere at 150° C. for 50 seconds. The radiation-sensitive resin compositions of the Examples and Comparative Examples were applied to the surface of the substrate by spin coating and pre-baked (PB) for 60 seconds on a hot plate at a temperature shown in Table 5 to form a resist film with a thickness of 200 nm.

The resist films were exposed to radiation through a mask pattern using a full field reduced projection exposure apparatus ("S306C" manufactured by Nikon Corp., NA 0.78). After PEB for 60 seconds at a temperature shown in Table 5, the resist films were developed using a 2.38 mass % TMAH aqueous solution at 25° C. for 60 seconds, washed with water, and dried to form positive-tone resist patterns.

A dose ($mJ/cm^2$) when a 1:1 line-and-space pattern having a line width of 110 nm was formed through a 1:1 line-and-space mask having a line width of 110 nm was determined to be an optimum dose ($mJ/cm^2$) which is regarded as "sensitivity". The measurement was carried out using a scanning electron microscope ("S-9220" manufactured by Hitachi High-Technologies Corporation).

(3) High-Density Line Depth of Focus (μm)

A swing width of focus when a pattern dimension resolved by 110 nm 1L/1S mask pattern at an optimum dose is within ±10% of the designed dimension of the mask was regarded as a high-density line depth of focus. When the high-density line depth of focus was 0.20 μm or more, the product was evaluated as "Good"; and when it was less than 0.20 μm, the product was evaluated as "Bad". The above-mentioned scanning electron microscope was used for inspecting the pattern dimension.

(4) Isolated Line Depth of Focus (μm)

The swing width of focus when a 120 nmL/1400 nmP pattern dimension resolved by 140 nmL/1400 nmP mask pattern at an optimum dose is within the range of 108 to 132 nmL/1400 nmP was regarded as an isolated line depth of focus. When the isolated line depth of focus was 0.10 μm or more, the product was evaluated as "Good"; and when it was less than 0.10 μm, the product was evaluated as "Bad". The above-mentioned scanning electron microscope was used for inspecting the pattern dimension.

TABLE 5

| | PB (° C.) | PEB (° C.) | Peel margin (%) | Sensitivity ($mJ/cm^2$) | High density line depth of focus (μm) | Isolated line depth of focus (μm) |
|---|---|---|---|---|---|---|
| Example 1 | 100 | 125 | 138 (Good) | 20 | 0.35 | 0.2 |
| Example 2 | 105 | 130 | 120 (Good) | 27 | 0.3 | 0.2 |
| Example 3 | 110 | 120 | >150 (Good) | 23 | 0.4 | 0.15 |
| Example 4 | 100 | 120 | 127 (Good) | 25 | >0.5 | 0.15 |
| Example 5 | 95 | 110 | >150 (Good) | 13 | 0.35 | 0.15 |
| Example 6 | 100 | 130 | 114 (Good) | 32 | 0.4 | 0.25 |
| Example 7 | 100 | 105 | 142 (Good) | 24 | 0.35 | 0.15 |
| Example 8 | 120 | 105 | 133 (Good) | 22 | 0.3 | 0.2 |
| Example 9 | 95 | 105 | 140 (Good) | 30 | 0.25 | 0.05 |
| Example 10 | 90 | 100 | 125 (Good) | 42 | 0.2 | 0.1 |
| Example 11 | 95 | 95 | 148 (Good) | 41 | 0.2 | 0.1 |
| Example 12 | 100 | 110 | >150 (Good) | 20 | 0.15 | 0.05 |
| Comparative Example 1 | 100 | 120 | 78 (Bad) | 33 | 0.4 | 0.25 |
| Comparative Example 2 | 110 | 130 | 42 (Bad) | 24 | 0.5 | 0.05 |
| Comparative Example 3 | 100 | 105 | 96 (Bad) | 27 | 0.25 | 0 |
| Comparative Example 4 | 80 | 100 | Could not be evaluated | Not resolved | — | — |

TABLE 6

|  | PB (° C.) | PEB (° C.) | Peel margin (%) | Sensitivity (mJ/cm$^2$) | High density line depth of focus (μm) | Isolated line depth of focus (μm) |
|---|---|---|---|---|---|---|
| Example 13 | 105 | 130 | 138 (Good) | 20 | 0.4 | 0.2 |
| Example 14 | 110 | 130 | 125 (Good) | 27 | 0.35 | 0.3 |
| Example 15 | 110 | 110 | 125 (Good) | 26 | 0.4 | 0.35 |
| Example 16 | 120 | 120 | 125 (Good) | 21 | 0.4 | >0.5 |
| Example 17 | 95 | 110 | 130 (Good) | 25 | >0.5 | 0.15 |
| Example 18 | 100 | 125 | 120 (Good) | 33 | >0.5 | 0.1 |
| Example 19 | 100 | 105 | 120 (Good) | 27 | 0.45 | 0.15 |
| Example 20 | 120 | 105 | 133 (Good) | 22 | 0.25 | 0.45 |
| Example 21 | 100 | 105 | 135 (Good) | 17 | 0.25 | 0.3 |
| Example 22 | 100 | 120 | 103 (Good) | 31 | 0.35 | 0.35 |
| Example 23 | 100 | 115 | 108 (Good) | 26 | 0.2 | 0.1 |
| Example 24 | 100 | 115 | 130 (Good) | 25 | 0.35 | 0.45 |
| Comparative Example 5 | 100 | 105 | 86 (Bad) | 20 | 0.35 | >0.5 |

As clearly shown in Table 5 and 6, it was found that various characteristics of a resist such as peel margin, high density line depth of focus, and isolated line depth of focus can be improved by using the radiation-sensitive resin composition of the embodiment of the present invention.

Therefore, the radiation-sensitive resin composition can be suitably used as a lithography material utilizing an ArF excimer laser as a light source.

The radiation-sensitive resin composition of the embodiment of the present invention exhibits a wide depth of focus and excellent pattern peeling resistance. Therefore, the composition can be suitably used as a lithography material utilizing an ArF excimer laser as a light source.

Obviously, numerous modifications and variations of the present invention are possible in the light of the above teachings. It is therefore to be understood that within the scope of the appended claims, the invention may be practiced otherwise than as specifically described herein.

What is claimed as new and desired to be secured by Letters Patent of the United States is:

1. A polymer comprising:
   a repeating unit (a-1) shown by a following formula (a-1);
   a repeating unit (a-2) shown by a following formula (a-2); and
   a GPC weight average molecular weight of about 1000 to about 100,000,

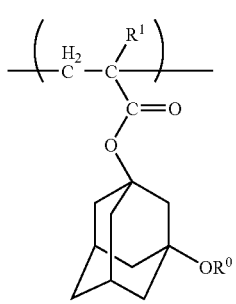
(a-1)

wherein R$^0$ represents an alkyl group having 1 to 5 carbon atoms in which at least one hydrogen atom is substituted by a hydroxyl group, and R$^1$ represents a hydrogen atom, a methyl group, or a trifluoromethyl group,

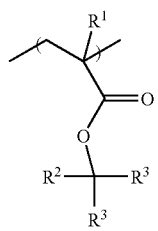
(a-2)

wherein R$^1$ represents a hydrogen atom, a methyl group, or a trifluoromethyl group, R$^2$ represents an alkyl group having 1 to 4 carbon atoms, and R$^3$ represents an alkyl group having 1 to 4 carbon atoms, a substituted or unsubstituted monovalent cyclic hydrocarbon group having 4 to 20 carbon atoms, or a divalent cyclic hydrocarbon group having 4 to 20 carbon atoms formed by R$^3$ and R$^3$ bonding to each other together with a carbon atom to which the R$^3$ and R$^3$ bond.

2. The polymer according to claim 1, wherein the repeating unit (a-2) comprises at least one of a repeating unit shown by a following formula (a-21) and a repeating unit shown by a following formula (a-22),

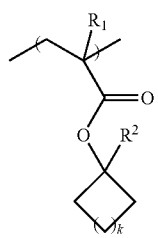
(a-21)

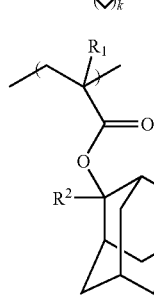
(a-22)

wherein $R^1$ represents a hydrogen atom, a methyl group, or a trifluoromethyl group, $R^2$ represents an alkyl group having 1 to 4 carbon atoms, and k represents an integer from 1 to 10.

3. The polymer according to claim 1, further comprising at least one of a repeating unit (a-3) shown by a following formula (a-3) and a repeating unit (a-4) having a lactone structure,

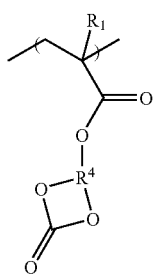
(a-3)

wherein $R^1$ represents a hydrogen atom, a methyl group, or a trifluoromethyl group, and $R^4$ represents a trivalent organic group.

4. The polymer according to claim 1, wherein the repeating unit (a-1) comprises a structure shown by a following formula (a-5),

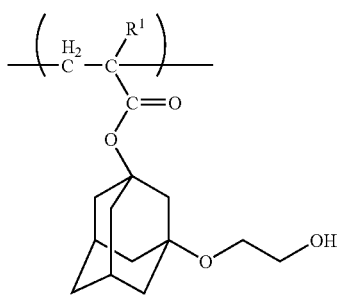
(a-5)

wherein $R^1$ represents a hydrogen atom, a methyl group, or a trifluoromethyl group.

5. The polymer according to claim 1, wherein a content of the repeating unit (a-1) in the polymer is about 1 to about 50 mol %.

6. A positive-tone radiation-sensitive resin composition comprising:
   a polymer (A) comprising a repeating unit (a-1) shown by a following formula (a-1);
   an acid generator (B); and
   a solvent (D),

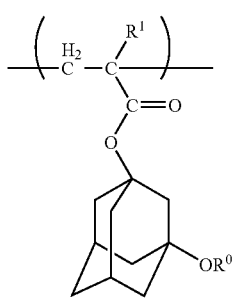
(a-1)

wherein $R^0$ represents an alkyl group having 1 to 5 carbon atoms in which at least one hydrogen atom is substituted by a hydroxyl group, and $R^1$ represents a hydrogen atom, a methyl group, or a trifluoromethyl group.

7. The composition according to claim 6, wherein the polymer (A) further comprises a repeating unit (a-2) shown by a following formula (a-2),

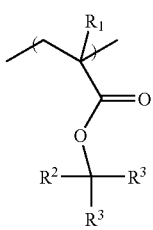
(a-2)

wherein $R^1$ represents a hydrogen atom, a methyl group, or a trifluoromethyl group, $R^2$ represents an alkyl group having 1 to 4 carbon atoms, and $R^3$ represents an alkyl group having 1 to 4 carbon atoms, a substituted or unsubstituted monovalent cyclic hydrocarbon group having 4 to 20 carbon atoms, or a divalent cyclic hydrocarbon group having 4 to 20 carbon atoms formed by $R^3$ and $R^3$ bonding to each other together with a carbon atom to which the $R^3$ and $R^3$ bond.

8. The composition according to claim 7, wherein the repeating unit (a-2) comprises a repeating unit shown by a following formula (a-21) or a repeating unit shown by a following formula (a-22),

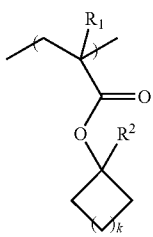
(a-21)

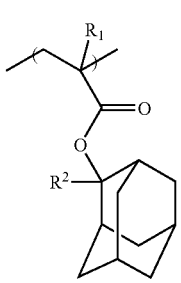
(a-22)

wherein $R^1$ represents a hydrogen atom, a methyl group, or a trifluoromethyl group, $R^2$ represents an alkyl group having 1 to 4 carbon atoms, and k represents an integer from 1 to 10.

9. The composition according to claim 6, wherein the polymer (A) further comprises at least one of a repeating unit (a-3)

shown by a following formula (a-3) and a repeating unit (a-4) having a lactone structure,

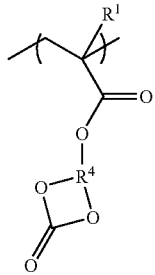
(a-3)

wherein R¹ represents a hydrogen atom, a methyl group, or a trifluoromethyl group, and R⁴ represents a trivalent organic group.

10. The composition according to claim 6, wherein the repeating unit (a-1) has a structure shown by a following formula (a-5),

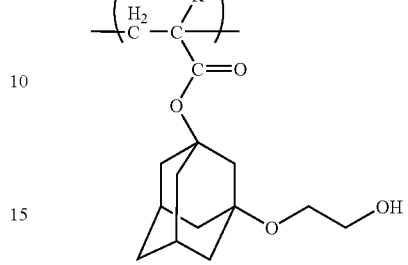
(a-5)

wherein R¹ represents a hydrogen atom, a methyl group, or a trifluoromethyl group.

* * * * *